(12) United States Patent
Hu

(10) Patent No.: US 12,014,934 B2
(45) Date of Patent: Jun. 18, 2024

(54) SEMICONDUCTOR SUBSTRATE STRUCTURE AND MANUFACTURING METHOD THEREOF

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 0 days.

(21) Appl. No.: 17/980,556

(22) Filed: Nov. 4, 2022

(65) Prior Publication Data

US 2023/0136778 A1    May 4, 2023

Related U.S. Application Data

(60) Provisional application No. 63/275,914, filed on Nov. 4, 2021.

(30) Foreign Application Priority Data

Oct. 24, 2022   (TW) .................................. 111140307

(51) Int. Cl.
| | | |
|---|---|---|
| H01L 21/48 | (2006.01) | |
| H01L 21/56 | (2006.01) | |
| H01L 23/00 | (2006.01) | |
| H01L 23/498 | (2006.01) | |
| H01L 23/538 | (2006.01) | |

(52) U.S. Cl.
CPC ........ *H01L 21/4857* (2013.01); *H01L 21/568* (2013.01); *H01L 23/49894* (2013.01); *H01L 23/5383* (2013.01); *H01L 24/16* (2013.01); *H01L 24/32* (2013.01); *H01L 24/73* (2013.01); *H01L 2224/16225* (2013.01); *H01L 2224/32225* (2013.01); *H01L 2224/73204* (2013.01)

(58) Field of Classification Search
CPC ....... H01L 21/568; H01L 24/16; H01L 24/32; H01L 24/73; H01L 2224/32225; H01L 21/4857; H01L 23/49894; H01L 23/5383
USPC .......................................................... 438/126
See application file for complete search history.

(56) References Cited

U.S. PATENT DOCUMENTS

| | | | |
|---|---|---|---|
| 6,525,415 B2* | 2/2003 | Koyanagi | ........... H01L 27/0688 257/700 |
| 2019/0067358 A1 | 2/2019 | Lin et al. | |
| 2023/0136788 A1* | 5/2023 | Hu | .......................... H01L 24/13 257/734 |

OTHER PUBLICATIONS

"Office Action of Taiwan Counterpart Application", issued on Nov. 13, 2023, p. 1-p. 6.

* cited by examiner

*Primary Examiner* — Jasmine J Clark
(74) *Attorney, Agent, or Firm* — JCIPRNET

(57) ABSTRACT

A semiconductor substrate structure includes a first group of circuit structure and a second group of circuit structure. The first group of circuit structure includes multiple first circuit layers and a first bonding layer. The second group of circuit structure includes multiple second circuit layers and a second bonding layer. The second group of circuit structure is disposed on the first group of circuit structure and is electrically connected to the first group of circuit structure. The first bonding layer is bonded to the second bonding layer to form a multilayer redistribution structure. A manufacturing method of the semiconductor substrate structure is also provided.

49 Claims, 29 Drawing Sheets

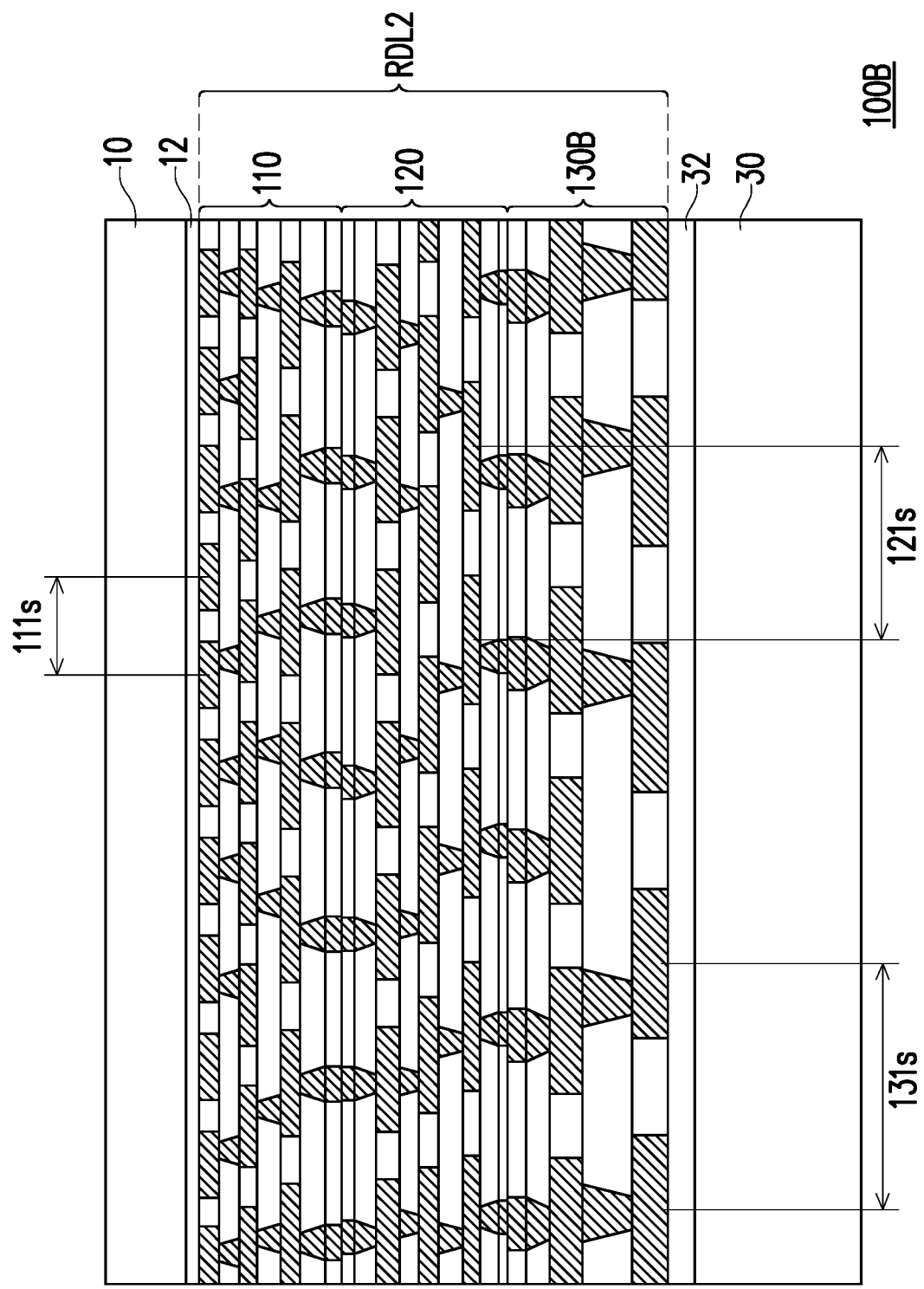

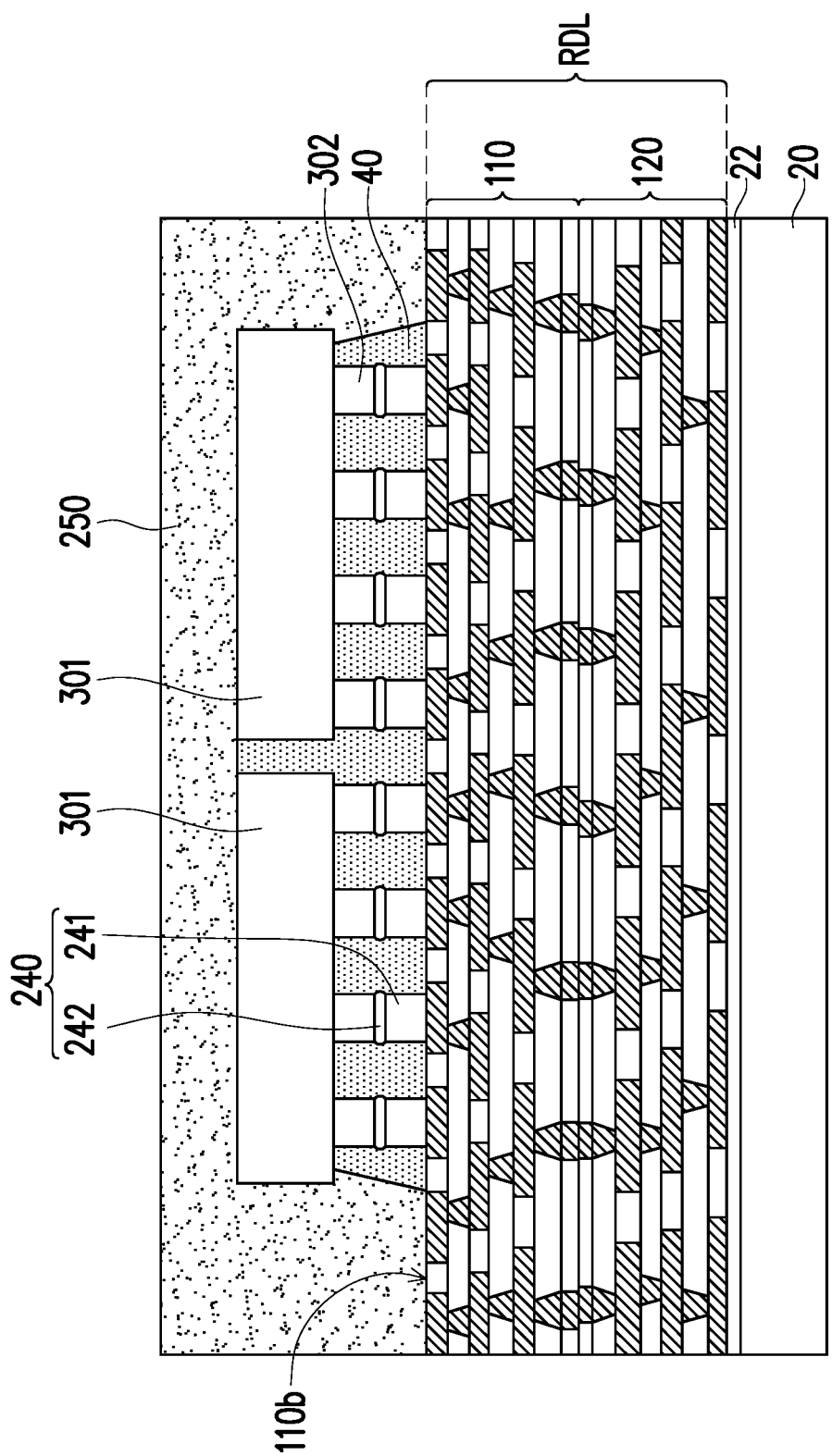

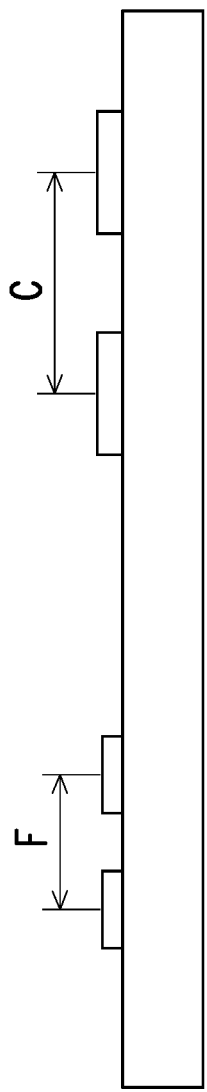
FIG. 4A
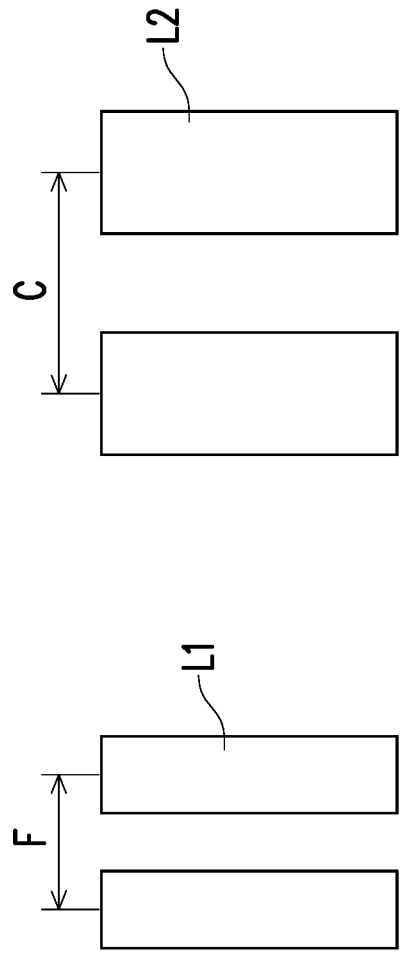
FIG. 4B
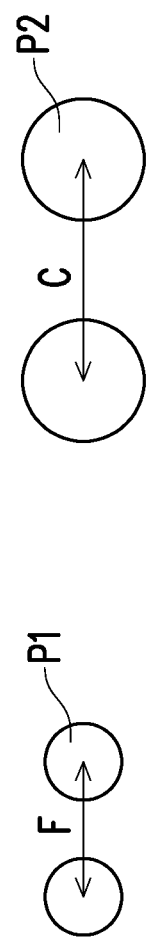

SEMICONDUCTOR SUBSTRATE STRUCTURE AND MANUFACTURING METHOD THEREOF

CROSS-REFERENCE TO RELATED APPLICATION

This application claims the priority benefit of the U.S. provisional application Ser. No. 63/275,914, filed on Nov. 4, 2021, and the priority benefit of Taiwan application serial no. 111140307, filed on Oct. 24, 2022. The entirety of the above-mentioned patent application is hereby incorporated by reference herein and made a part of this specification.

BACKGROUND

Technical Field

The disclosure relates to a semiconductor substrate structure and a manufacturing method thereof.

Description of Related Art

In applications of integrated circuit, the redistribution circuit layer (RDL) is a multilayer structure formed by conductive material and dielectric material. The redistribution circuit layer is often manufactured on a temporary carrier. However, the material used in the aforementioned multilayer structure and the material used in the temporary carrier may have a coefficient of thermal expansion (CTE) mismatch. Thus, warpage is likely to occur in the process of continuously forming the aforementioned multilayer structure (at least four layers continuously) on the temporary carrier. The more the layers, the more obvious the warpage. As a result, the yield and electrical performance of the semiconductor substrate structure will be adversely affected.

SUMMARY

The disclosure provides a semiconductor substrate structure and a manufacturing method thereof, which maintains better yield and electrical performance while having a multilayer redistribution structure.

The semiconductor substrate structure of the disclosure includes a first group of circuit structure and a second group of circuit structure. The first group of circuit structure includes multiple first circuit layers and a first bonding layer. The second group of circuit structure includes multiple second circuit layers and a second bonding layer. The second group of circuit structure is disposed on the first group of circuit structure and is electrically connected to the first group of circuit structure. The first bonding layer is bonded to the second bonding layer to form a multilayer redistribution structure.

The semiconductor substrate structure of the disclosure includes a first group of circuit structure, a second group of circuit structure, and a third group of circuit structure. The first group of circuit structure includes multiple first circuit layers and a first bonding layer. The second group of circuit structure includes multiple second circuit layers and a second bonding layer. The second group of circuit structure is disposed on the first group of circuit structure and is electrically connected to the first group of circuit structure. The first bonding layer is bonded to the second bonding layer. The third group of circuit structure includes multiple third circuit layers and a third bonding layer. The second group of circuit structure is disposed between the first group of circuit structure and the third group of circuit structure and are electrically connected with each other. The second group of circuit structure includes another bonding layer relative to the first group of circuit structure, and the another bonding layer is bonded to the third bonding layer to form a multilayer redistribution structure.

The manufacturing method of a semiconductor substrate structure of the disclosure includes at least the following process. A first group of circuit structure is formed on a first temporary carrier. The first group of circuit structure includes multiple first circuit layers and a first bonding layer. A second group of circuit structure is formed on a second temporary carrier. The second group of circuit structure includes multiple second circuit layers and a second bonding layer. The first group of circuit structure and the second group of circuit structure are directly bonded, so that the first bonding layer is bonded to the second bonding layer.

The manufacturing method of a semiconductor substrate structure of the disclosure includes at least the following process. A first group of circuit structure is formed on a first temporary carrier. The first group of circuit structure includes multiple first circuit layers and a first bonding layer. A second group of circuit structure is formed on a second temporary carrier. The second group of circuit structure includes multiple second circuit layers and a second bonding layer. The first group of circuit structure and the second group of circuit structure are directly bonded, so that the first bonding layer is bonded to the second bonding layer. A third group of circuit structure is formed on the second group of circuit structure. The third group of circuit structure includes multiple third circuit layers and a third bonding layer. The second group of circuit structure and the third group of circuit structure are bonded. The second group of circuit structure includes another bonding layer relative to the first group of circuit structure, and the another bonding layer is bonded to the third bonding layer to form a multilayer redistribution structure.

The manufacturing method of a semiconductor substrate structure of the disclosure includes at least the following process. A second group of circuit structure is formed on a second temporary carrier. A third group of circuit structure is formed on the second group of circuit structure. The second group of circuit structure and the third group of circuit structure are bonded. The second temporary carrier is removed. A first group of circuit structure is formed on a first temporary carrier. The first group of circuit structure and the second group of circuit structure are directly bonded. The first temporary carrier is removed. A conductive pillar and a conductive cap are formed on a surface of the first group of circuit structure, and an external terminal is formed on a surface of the third group of circuit structure.

The semiconductor substrate structure of the disclosure includes a first group of circuit structure and a second group of circuit structure. The second group of circuit structure is disposed on the first group of circuit structure and is electrically connected to the first group of circuit structure to form a multilayer redistribution structure. A dielectric layer in the first group of circuit structure and a dielectric layer in the second group of circuit structure are organic thin films.

Based on the above, the disclosure first separately manufactures multiple groups of circuit structure on the temporary carrier, and then directly bonds and assembles the aforementioned multiple groups of circuit structure into a multilayer redistribution structure. In this way, compared with the multilayer redistribution structure produced continuously at one time, the warpage may be effectively reduced. Thus, the semiconductor substrate structure maintains better yield and electrical performance while having a multilayer redistribution structure.

In order to make the above-mentioned features and advantages of the disclosure comprehensible, embodiments accompanied with drawings are described in detail below.

BRIEF DESCRIPTION OF THE DRAWINGS

FIG. 1M, FIG. 1N, and FIG. 1O are partial schematic cross-sectional views illustrating a semiconductor substrate structure according to another embodiments of the disclosure.

FIG. 2A to FIG. 2D are partial schematic cross-sectional views illustrating a manufacturing method of a semiconductor structure according to some other embodiments of the disclosure.

FIG. 4A is a partial schematic cross-sectional view illustrating a pitch of a circuit structure.

FIG. 4B is a partial schematic top view corresponding to FIG. 4A.

Figure 3A:
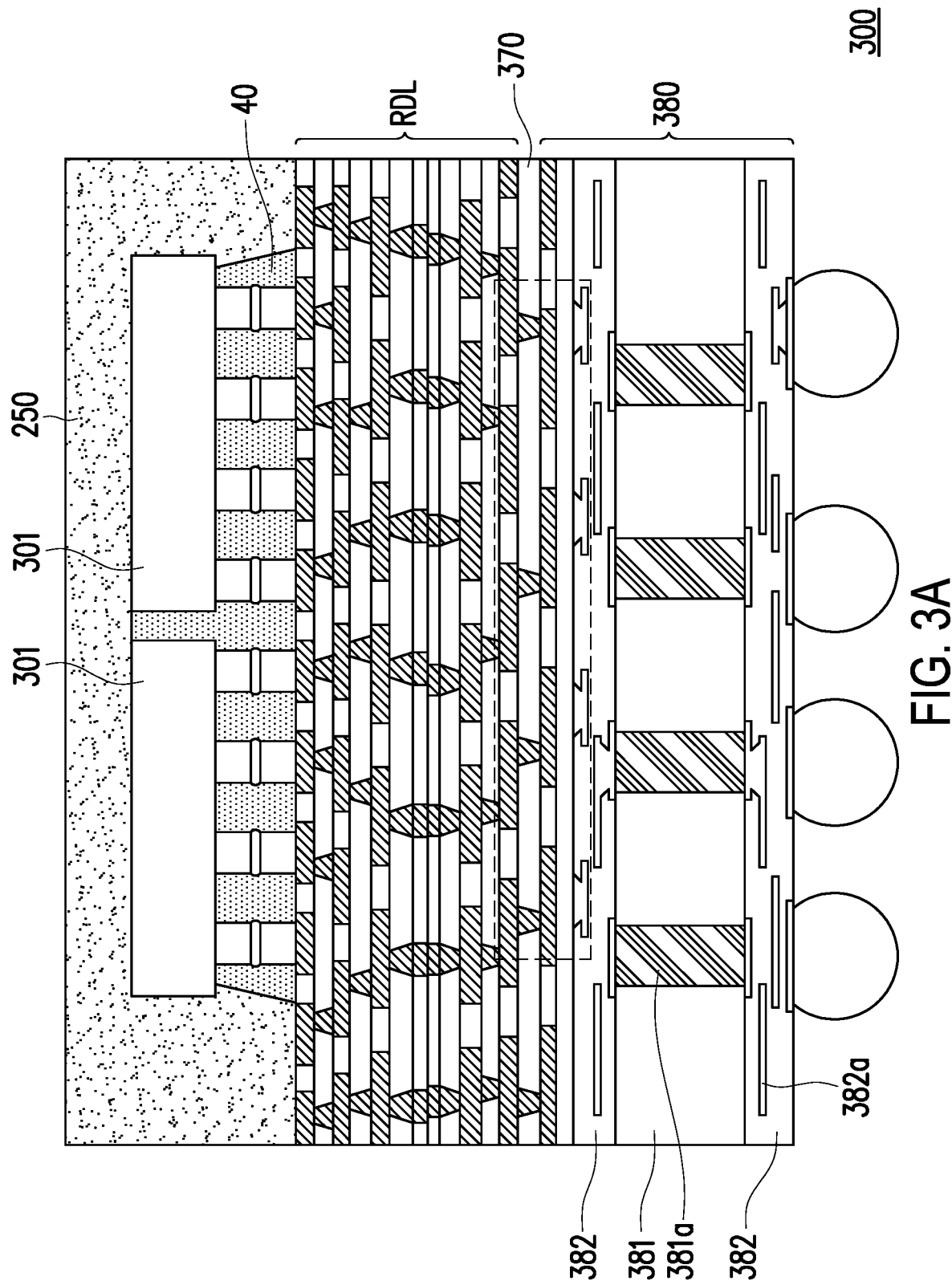
FIG. 3A is a partial schematic cross-sectional view illustrating a semiconductor structure according to some other embodiments of the disclosure.
Figure 3B:
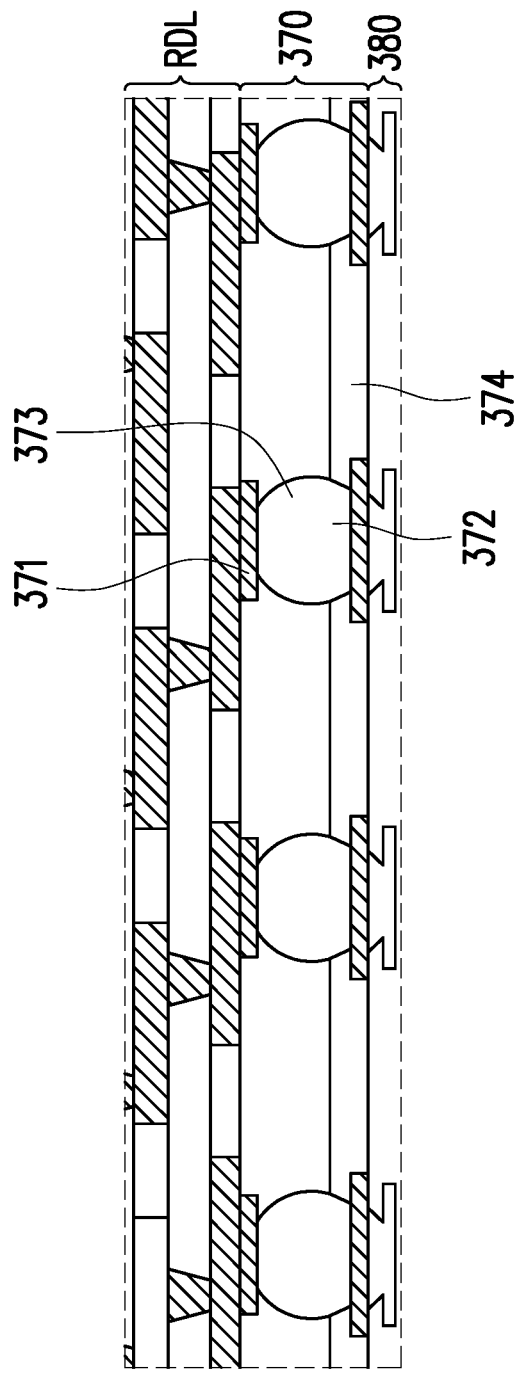
FIG. 3B and FIG. 3C are partial schematic cross-sectional views illustrating some specific embodiments of the connecting layer of FIG. 3A.
Figure 3C:
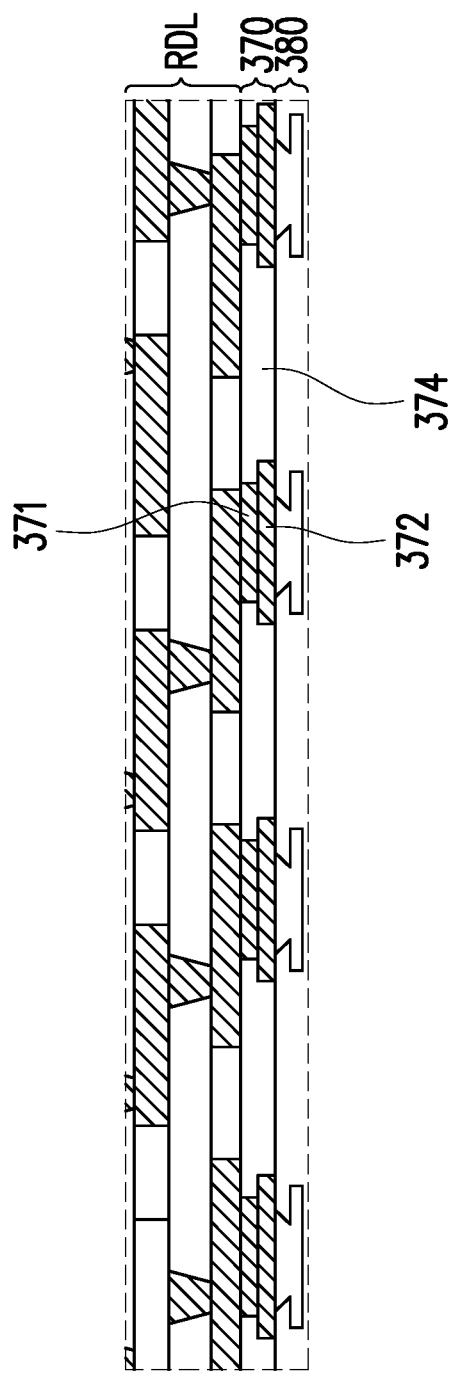

It should be noted that, FIG. 3B and FIG. 3C may be enlarged parts of the dotted frame in FIG. 3A.

DESCRIPTION OF THE EMBODIMENTS

Exemplary embodiments of the disclosure are described below comprehensively with reference to the figures, but the disclosure may also be implemented in different ways and should not be construed as limited to the embodiments described herein. In the drawings, for the sake of clarity, the size and thickness of various regions, parts, and layers may not be drawn to actual scale. In order to facilitate understanding, the same elements in the following description are described with the same symbols.

The disclosure is more comprehensively described with reference to the figures of this embodiment. However, the disclosure may also be implemented in various different forms, and is not limited to the embodiments in the present specification. Thicknesses, dimensions, and sizes of layers or regions in the drawings are exaggerated for clarity. The same reference numbers are used in the drawings and the description to indicate the same or like parts, which are not repeated in the following embodiments.

Directional terms (for example, upper, lower, right, left, front, back, top, and bottom) used herein only refer to the graphical use, and are not intended to imply absolute orientation.

It should be understood that, although the terms "first", "second", "third", or the like may be used herein to describe various elements, components, regions, layers, and/or portions, these elements, components, regions, and/or portions should not be limited by these terms. These terms are only used to distinguish one element, component, region, layer, or portion from another element, component, region, layer, or portion.

Unless otherwise defined, all terms (including technical and scientific terms) used herein have the same meaning as that commonly understood by one of ordinary skill in the art to which this disclosure belongs.

Figure 1A:
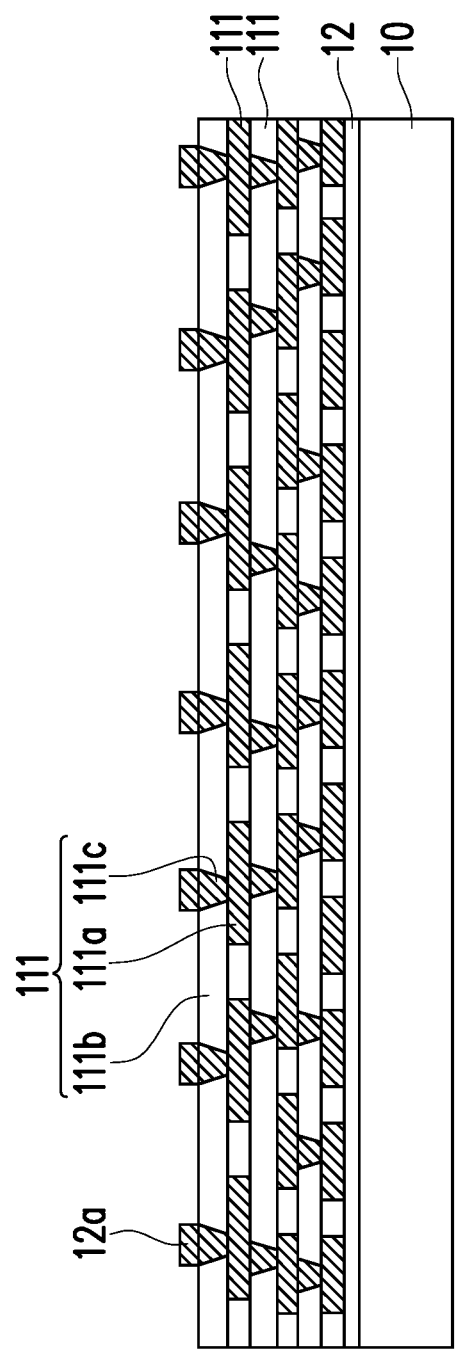
FIG. 1A to FIG. 1I are partial schematic cross-sectional views illustrating a manufacturing method of a semiconductor substrate structure according to some embodiments of the disclosure.
Figure 1B:
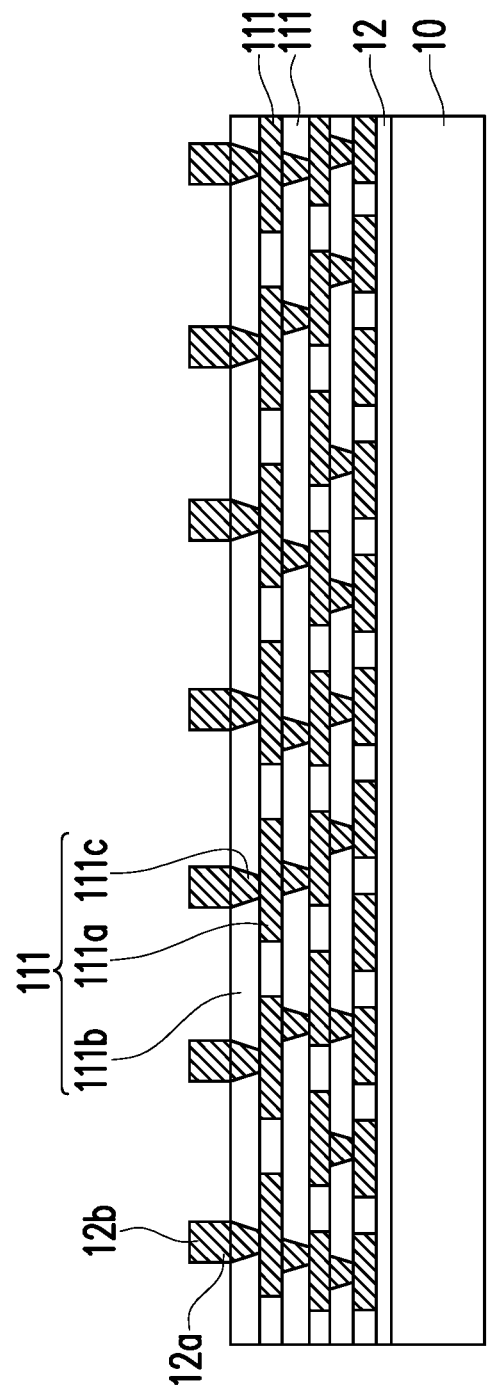
Figure 1C:
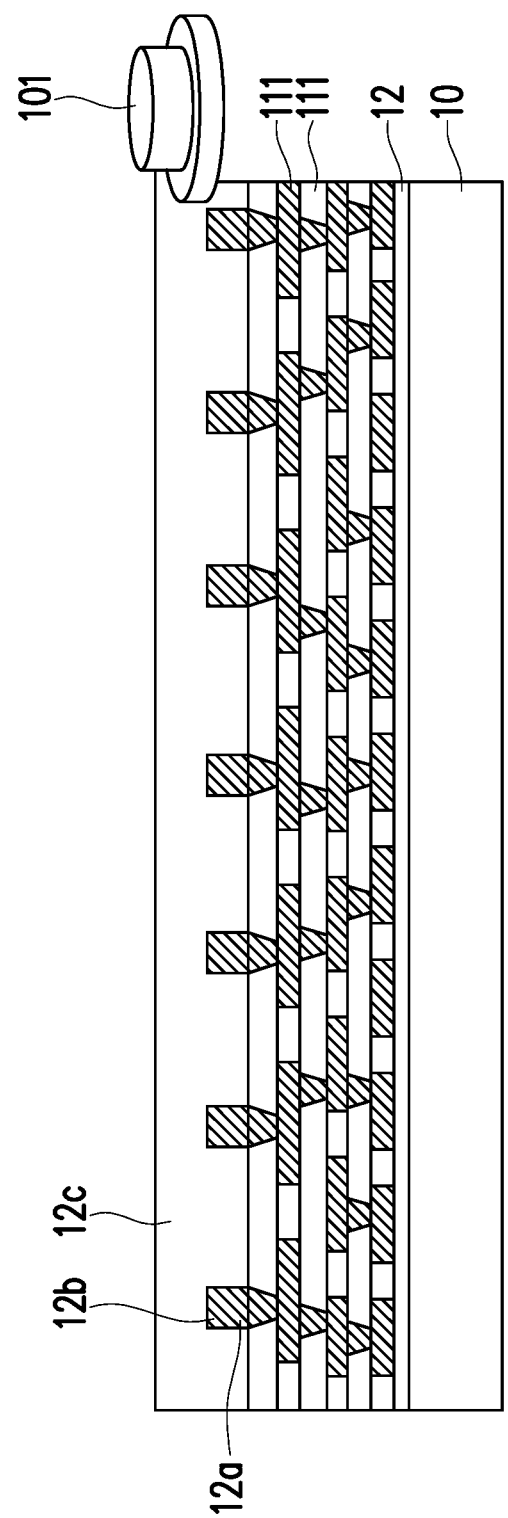

FIG. 1A to FIG. 1I are partial schematic cross-sectional views illustrating a manufacturing method of a semiconductor substrate structure according to some embodiments of the disclosure. FIG. 1J, FIG. 1K and FIG. 1L are partial schematic cross-sectional views illustrating a manufacturing method of the first group of circuit structure of FIG. 1D according to an alternative embodiment of the disclosure. FIG. 1M, FIG. 1N, and FIG. 1O are partial schematic cross-sectional views illustrating a semiconductor substrate structure according to another embodiments of the disclosure. FIG. 1P is a schematic view illustrating a bonding of a semiconductor substrate structure according to some embodiments of the disclosure. FIG. 1Q is a schematic view illustrating a semiconductor substrate structure after bonding according to some embodiments of the disclosure. FIG. 1R is a schematic view illustrating a semiconductor substrate structure after bonding of a prior art. Referring to FIG. 1A, multiple first circuit layers 111 are formed on a first temporary carrier 10. The first temporary carrier 10 may be made of glass, plastic, silicon, metal, or other suitable materials, as long as the material may withstand the subsequent process and simultaneously support the structure formed thereon.

In some embodiments, a first releasing layer 12 (e.g. a light-to-heat conversion film or other suitable releasing layer) may optionally be coated between the first temporary carrier 10 and a first group of circuit structure 110 for enhancing the peelability between the first temporary carrier 10 and the first group of circuit structure 110 in the subsequent process and improving the flatness of the first group of circuit structure 110, but the disclosure is not limited thereto.

Figure 1D:
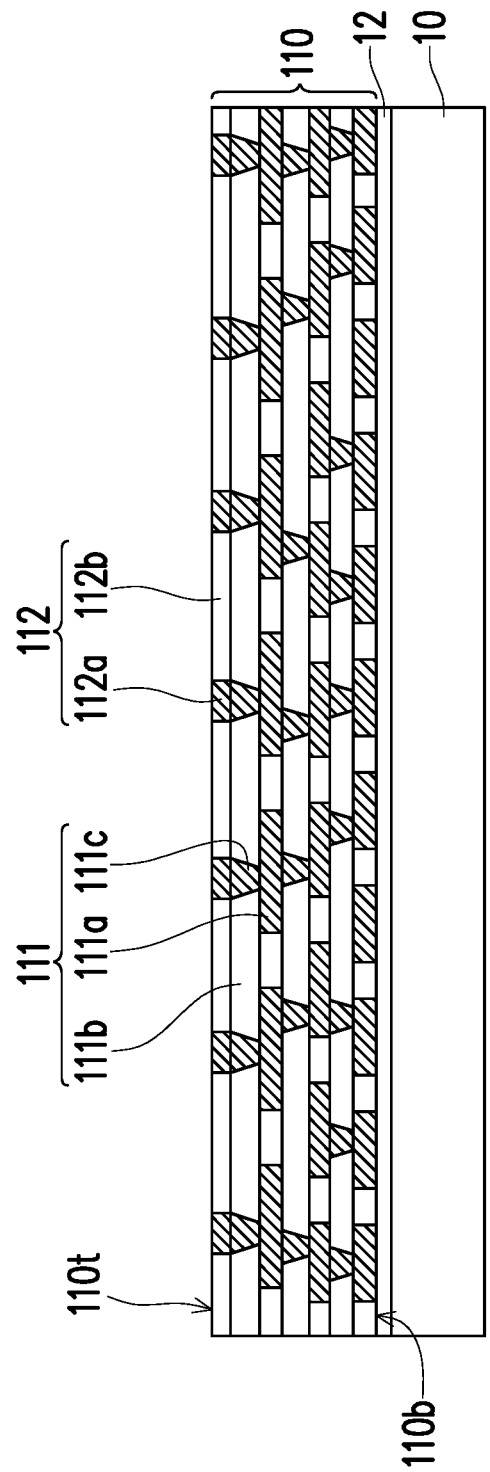

In this embodiment, multiple first circuit layers 111 (six layers are schematically depicted in FIG. 1A) and a first micro bump 12a (subsequently used to form a first bonding member 112a as shown in FIG. 1D) on the first circuit layer 111 may be formed on the first temporary carrier 10. Each of the first circuit layers 111 may include a first conductive pattern 111a, a first dielectric layer 111b, and/or a first conductive through hole 111c. The first conductive pattern 111a and the first conductive through hole 111c may be embedded in the first dielectric layer 111b, and the first micro bump 12a may be electrically connected to the first circuit layer 111, but the disclosure is not limited thereto.

In some embodiments, the first conductive pattern 111a may be formed on the first temporary carrier 10 using a deposition process, a lithography process, and an etching process or other suitable processes. Next, the first dielectric layer 111b including multiple openings may be formed on the first temporary carrier 10 using, for example, a coating process, a lithography etching process, or other suitable processes. The opening exposes at least a part of the first conductive pattern 111a for electrical connection. Then, a conductive material may be formed within the opening of the first dielectric layer 111b to form the first conductive through hole 111c using a suitable deposition process. Then, the above steps are performed multiple times to form multiple first circuit layers 111. Thereafter, the first micro bump 12a may be formed using a suitable deposition process. It should be noted that the first group of circuit structure 110 shown in FIG. 1A is merely an exemplary illustration, and more or fewer layers of the first circuit layers 111 may be formed according to circuit design requirements. As long as the first circuit layer 111 includes at least two layers, then the first circuit layer 111 belongs to the protection scope of the disclosure.

In some embodiments, the material of the first conductive pattern 111a and the first conductive through hole 111c may include copper, gold, nickel, aluminum, platinum, tin, combinations thereof, alloys thereof, or other suitable conductive materials. The material of the first dielectric layer 111b may include polyimide (PI), benzocyclobutene (BCB), polybenzoxazole (PBO), inorganic dielectric materials (e.g., silicon oxide, silicon nitride) or other suitable electrical insulating materials, but the disclosure is not limited thereto.

Referring to FIG. 1B, a first connecting bump 12b is formed on the first micro bump 12a. in the case of the material of the first micro bump 12a being substantially the same as the material of the first connecting bump 12b, the first micro bump 12a and the first connecting bump 12b may not have a substantial interface, but the disclosure is not limited thereto. The material of the first micro bump 12a and the first connecting bump 12b may also be different. In addition, other film layers (e.g., seed crystal layer, not shown) may also be included between the first micro bump 12a and the first circuit layer 111.

Referring to FIG. 1C and FIG. 1D, a first bonding dielectric material layer 12c is formed to cover the first micro bump 12a and the first connecting bump 12b. That is, a height of the first bonding dielectric material layer 12c is higher than a stacking height of the first micro bump 12a and the first connecting bump 12b. Next, a planarization process (e.g., a grinding process, a chemical mechanical polishing process, or a combination thereof) is performed to form the first bonding member 112a and a first bonding dielectric layer 112b. The first bonding member 112a and the first bonding dielectric layer 112b may be regarded as the first bonding layer 112. Furthermore, the planarization process (grinding and polishing) may be performed with a grinding wheel 101 until a top surface of the first connecting bump 12b is exposed, so that top surfaces of the first bonding member 112a and the first bonding dielectric layer 112b form a are coplanar. The first circuit layers 111 and the first bonding layer 112 may be regarded as the first group of circuit structure 110.

In some embodiments, the first bonding member 112a may be formed by sequentially stacking a seed crystal layer of materials such as titanium/copper (Ti/Cu) and an electroplating layer of materials such as copper, but the disclosure is not limited thereto. In some other embodiments, the first bonding member 112a may include other suitable conductive materials such as silver, gold, nickel, or alloys thereof, for example, Cu, Cu/Ni/Au, Cu/Ti, Cu/Ag, or the like. A second layer of material such as titanium may be formed on a first layer of material such as copper, and then a third layer of material such as silver is formed on the second layer by electroplating, sputtering, or other suitable deposition methods. A thickness of the second layer may be smaller than a thickness of the third layer, but the disclosure is not limited thereto. In addition, the first bonding member 112a may be in a form of a pad or a conductive pillar.

In some embodiments, the first bonding dielectric layer 112b may be a two-stage curing material (e.g., polyimide). Thus, in this stage, the aforementioned material may be in a half-cured state by controlling the curing temperature and/or the process parameters. In this way, the first bonding dielectric layer 112b may have a certain extent of elasticity and softness at this stage, but the disclosure is not limited thereto, and the first bonding dielectric layer 112b may also be directly cured.

In this embodiment, the first group of circuit structure 110 includes a first surface 110t and a second surface 110b opposite to each other. The second surface 110b is close to the first temporary carrier 10, and the first conductive pattern 111a and the first dielectric layer 111b on the second surface 110b may be substantially flush. In addition, the first conductive through hole 111c is gradually thicker toward a direction of the first bonding layers 112 (e.g., thicker in width or diameter). In other words, the first conductive through hole 111c is tapered toward a direction of the first temporary carrier 10 (e.g., tapered in width or diameter), but the disclosure is not limited thereto.

In some embodiments, distribution density of the first conductive pattern 111a on the second surface 110b of the first group of circuit structure 110 must be sufficient for subsequent mounting of semiconductor chips, but the disclosure is not limited thereto.

Figure 1E:
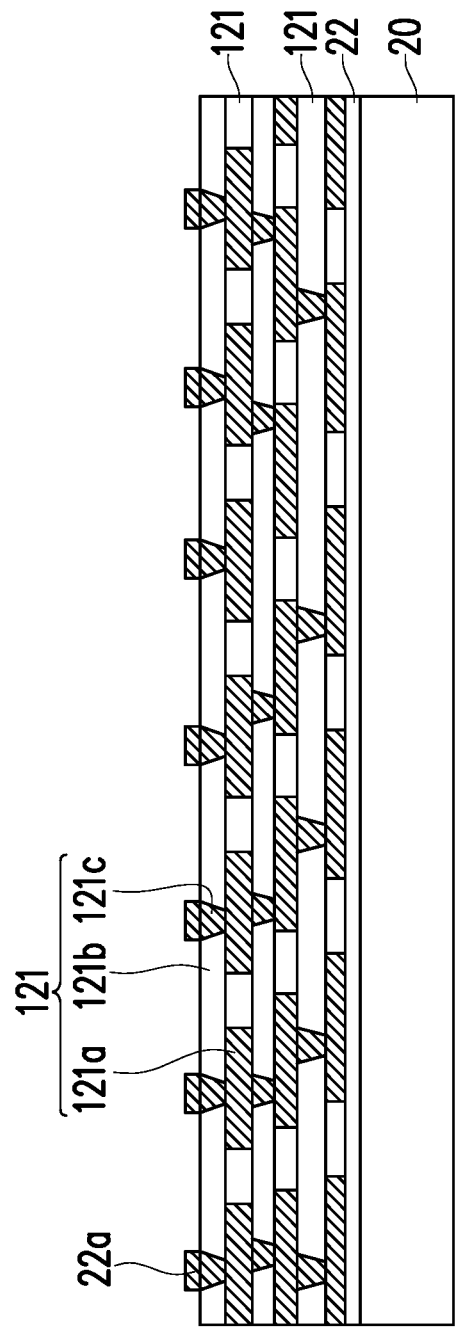

Referring to FIG. 1E, multiple second circuit layers 121 are formed on a second temporary carrier 20. In this embodiment, multiple second circuit layers 121 (six layers are schematically depicted in FIG. 1E) and a second micro bump 22a (subsequently used to form a second bonding member 122a as shown in FIG. 1H) on the second circuit layer 121 may be formed on the second temporary carrier 20. Each of the second circuit layers 121 may include a second conductive pattern 121a, a second dielectric layer 121b, and/or a second conductive through hole 121c. The second conductive pattern 121a and the second conductive through hole 121c may be embedded in the second dielectric layer 121b, and the second micro bump 22a may be electrically connected to the second circuit layer 121, but the disclosure is not limited thereto.

Figure 1F:
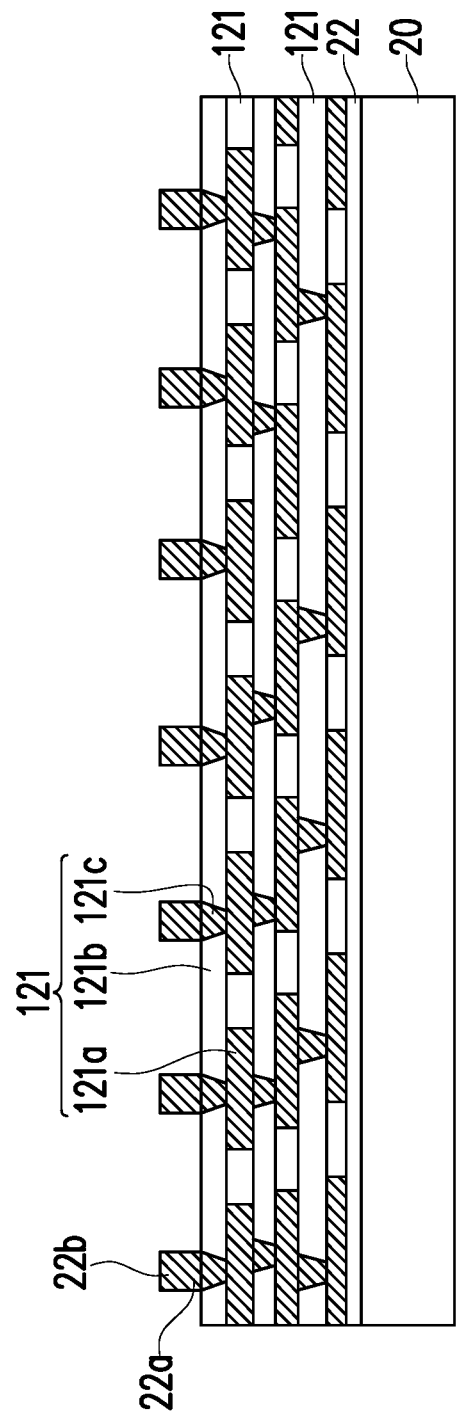

Referring to FIG. 1F, a second connecting bump 22b is formed on the second micro bump 22a. Other film layers (e.g., seed crystal layer, not shown) may also be included between the second micro bump 22a and the second circuit layer 121. The material of the second micro bump 22a and the second connecting bump 22b are similar to the material of the first micro bump 12a and the first connecting bump 12b, and details are not repeated herein.

Figure 1G:
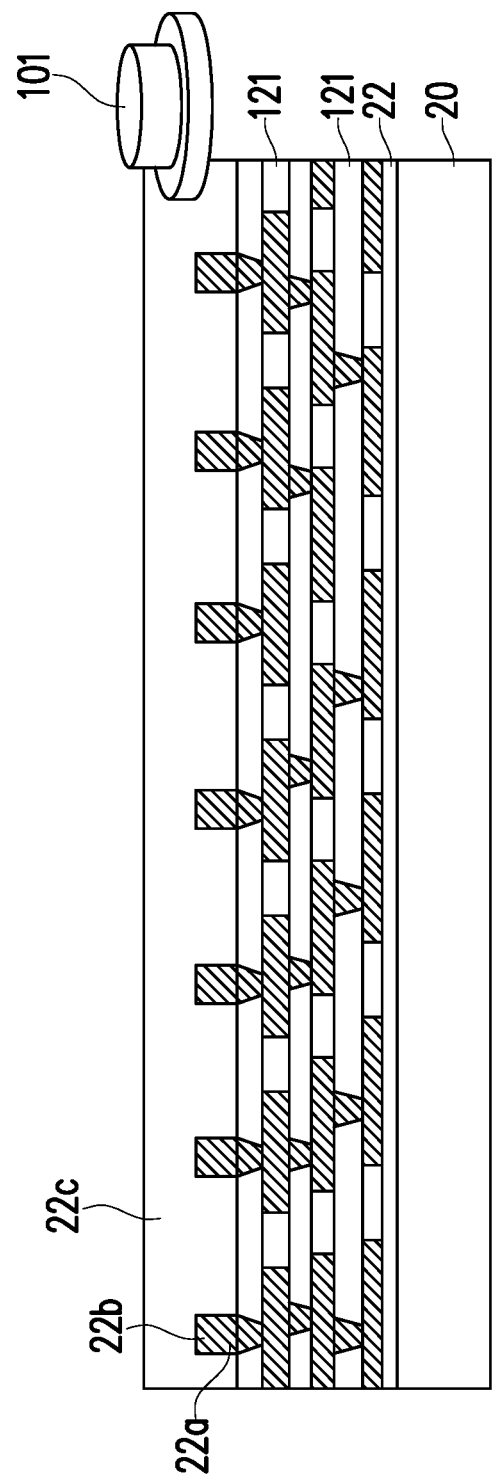
Figure 1H:
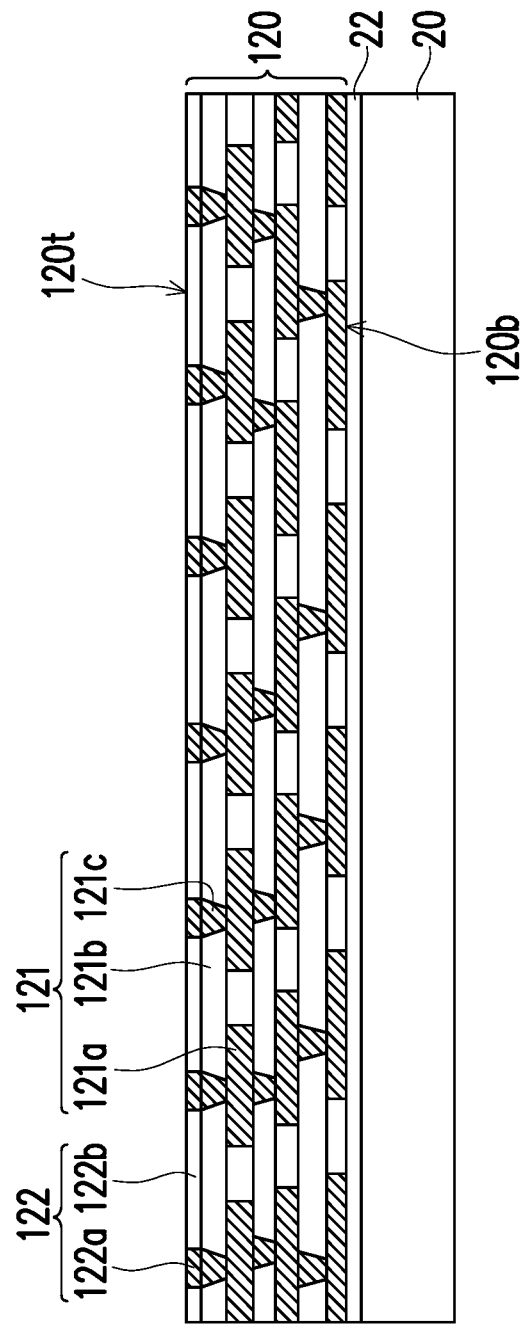

Referring to FIG. 1G and FIG. 1H, a second bonding dielectric material layer 22c is formed to cover the second micro bump 22a and the second connecting bump 22b. That is, a height of the second bonding dielectric material layer 22c is higher than a stacking height of the second micro bump 22a and the second connecting bump 22b. Next, a planarization process (e.g., a grinding process, a chemical mechanical polishing process, or a combination thereof) is performed to form the second bonding member 122a and a second bonding dielectric layer 122b. The second bonding member 122a and the second bonding dielectric layer 122b may be regarded as the second bonding layer 122. Furthermore, the planarization process (grinding and polishing) may be performed by the grinding wheel 101 until a top surface of the second connecting bump 22b is exposed, so that top surfaces of the second bonding member 122a and the second bonding dielectric layer 122b are coplanar. The second circuit layers 121 and the second bonding layer may be regarded as a second group of circuit structure 120.

In this embodiment, the second group of circuit structure 120 includes a third surface 120t and a fourth surface 120b opposite to each other. The fourth surface 120b is close to the second temporary carrier 20, and the second conductive pattern 121a and the second dielectric layer 121b on the fourth surface 120b may be substantially flush. In addition, the second conductive through hole 121c is gradually thicker toward a direction of the second bonding layers 122 (e.g., thicker in width or diameter). In other words, the second conductive through hole 121c is tapered toward a direction of the second temporary carrier 20 (e.g., tapered in width or diameter), but the disclosure is not limited thereto.

In some embodiments, the first conductive pattern 121a of the fourth surface 120b of the second group of circuit structure 120 may be used for subsequent installation of a substrate or an external terminal, but the disclosure is not limited thereto.

In some embodiments, a dielectric layer in the first group of circuit structure 110 (e.g., the first dielectric layer 111b and the first bonding dielectric layer 112b) and a dielectric layer in the second group of circuit structure 120 (e.g., the second dielectric layer 121b and the second bonding dielectric layer 122b) are organic thin films, but the disclosure is not limited thereto.

In some embodiments, a material of a dielectric layer in the first group of circuit structure 110 (e.g., the first dielectric layer 111b and the first bonding dielectric layer 112b) and a material of a dielectric layer in the second group of circuit structure 120 (e.g., the second dielectric layer 121b and the second bonding dielectric layer 122b) are the same (e.g., the dielectric (material) coefficients of thermal expansion are the same), but the disclosure is not limited thereto. In some other embodiments, the material of the dielectric layer in the first group of circuit structure 110 (e.g., the first dielectric layer 111b and the first bonding dielectric layer 112b) and the material of the dielectric layer in the second group of circuit structure 120 (e.g., the second dielectric layer 121b and the second bonding dielectric layer 122b) are different (e.g., the dielectric coefficients of thermal expansion are different), "different" may include similar but not identical.

In some embodiments, a difference between a dielectric coefficient of thermal expansion of the dielectric layer of the first group of circuit structure 110 (e.g., the first dielectric layer 111b and the first bonding dielectric layer 112b) and a dielectric coefficient of thermal expansion of the dielectric layer of the second group of circuit structure 120 (e.g., the second dielectric layer 121b and the second bonding dielectric layer 122b) may be less than 10%, but the disclosure is not limited thereto.

It should be noted that other specific details of forming the second group of circuit structure 120 (e.g., material, forming method, and setting of a second releasing layer 22) are similar to forming the first group of circuit structure 110, and details are not repeated herein.

Figure 1I:
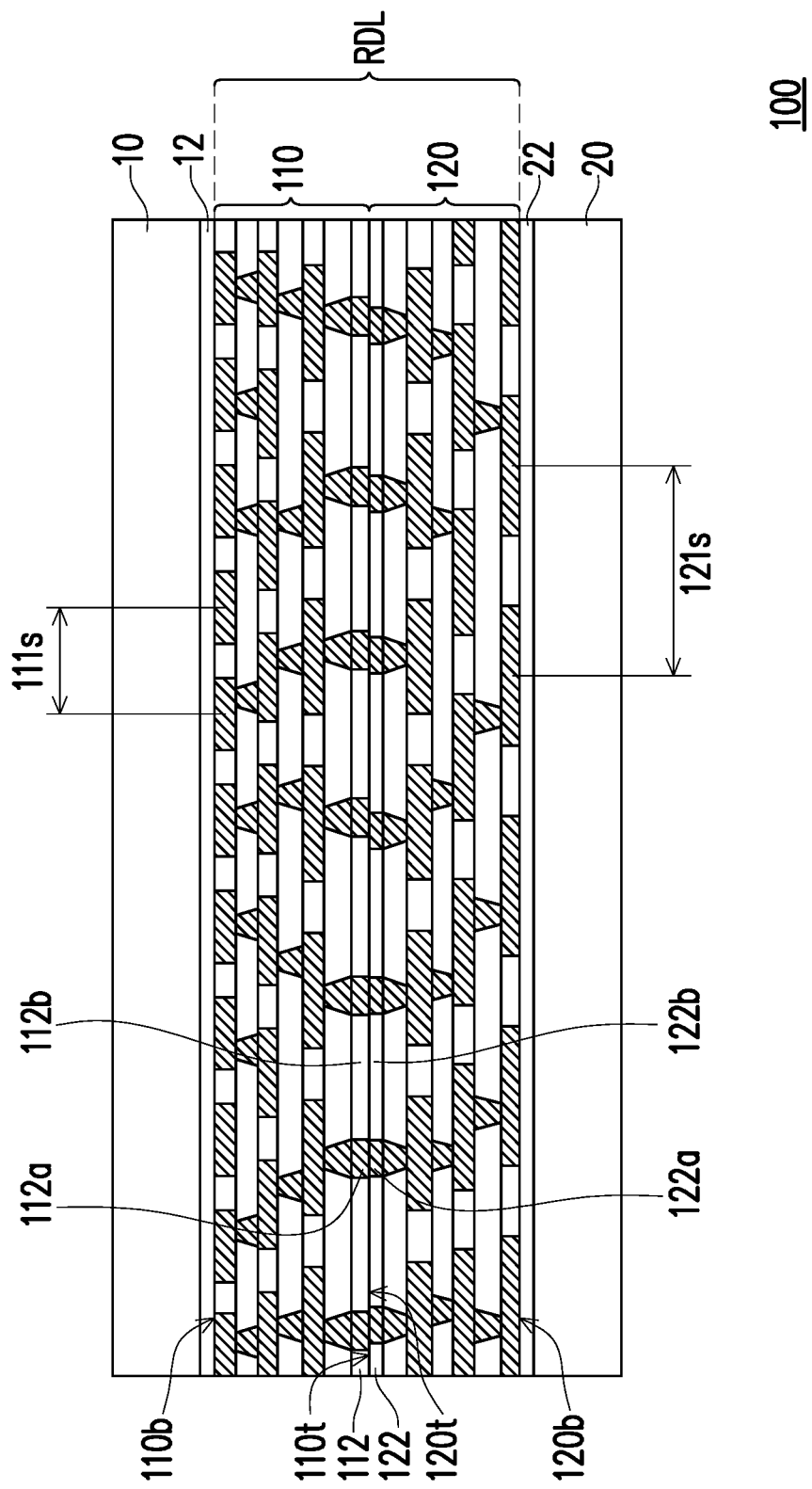
Figure 1J:
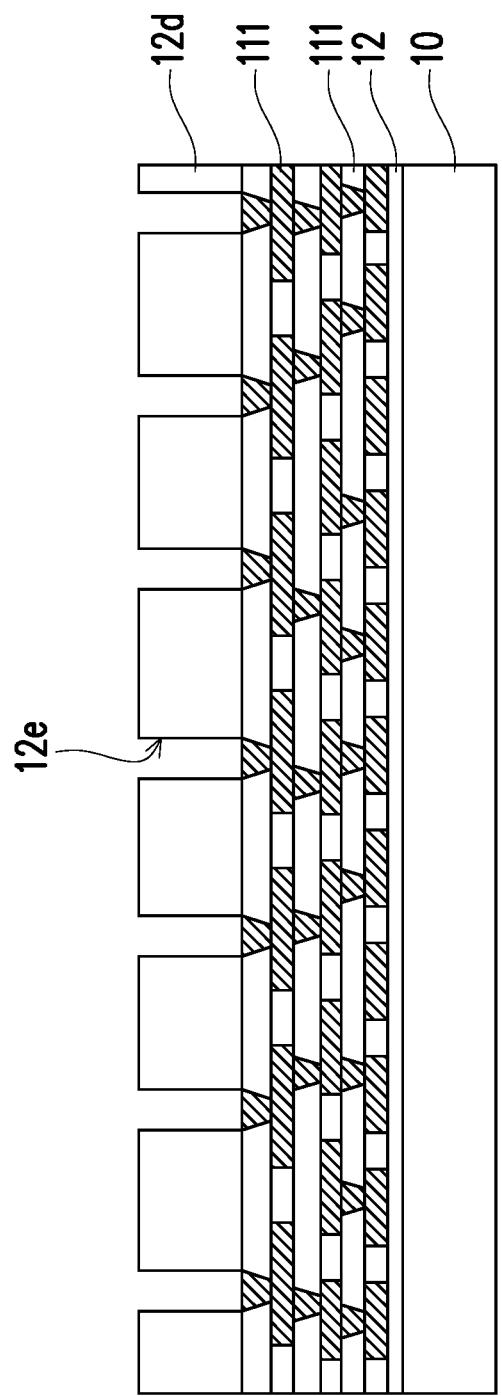
FIG. 1J, FIG. 1K and FIG. 1L are partial schematic cross-sectional views illustrating a manufacturing method of the first group of circuit structure of FIG. 1D according to an alternative embodiment of the disclosure.
Figure 1K:
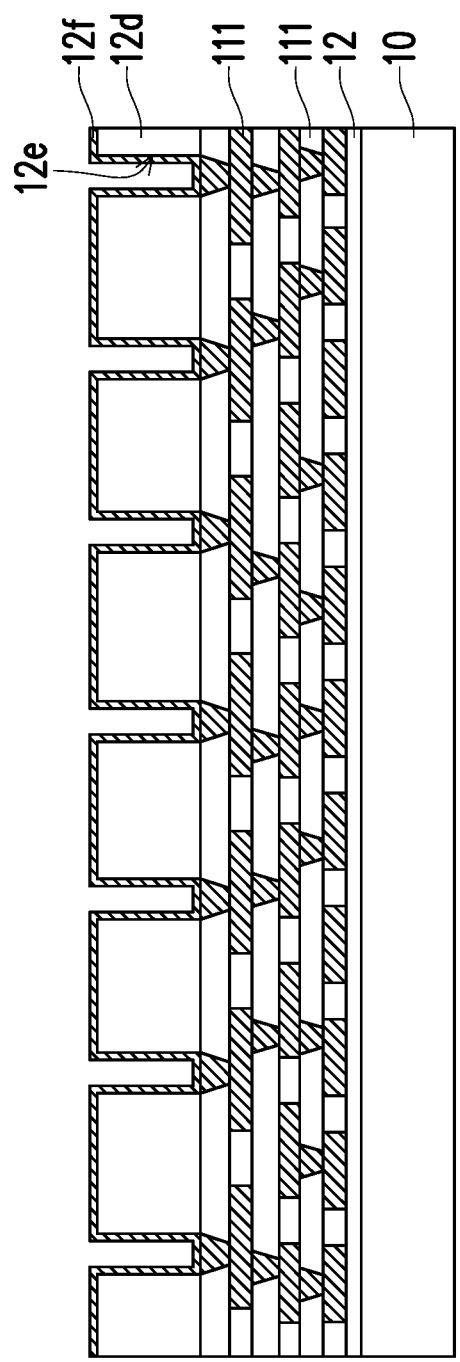
Figure 1L:
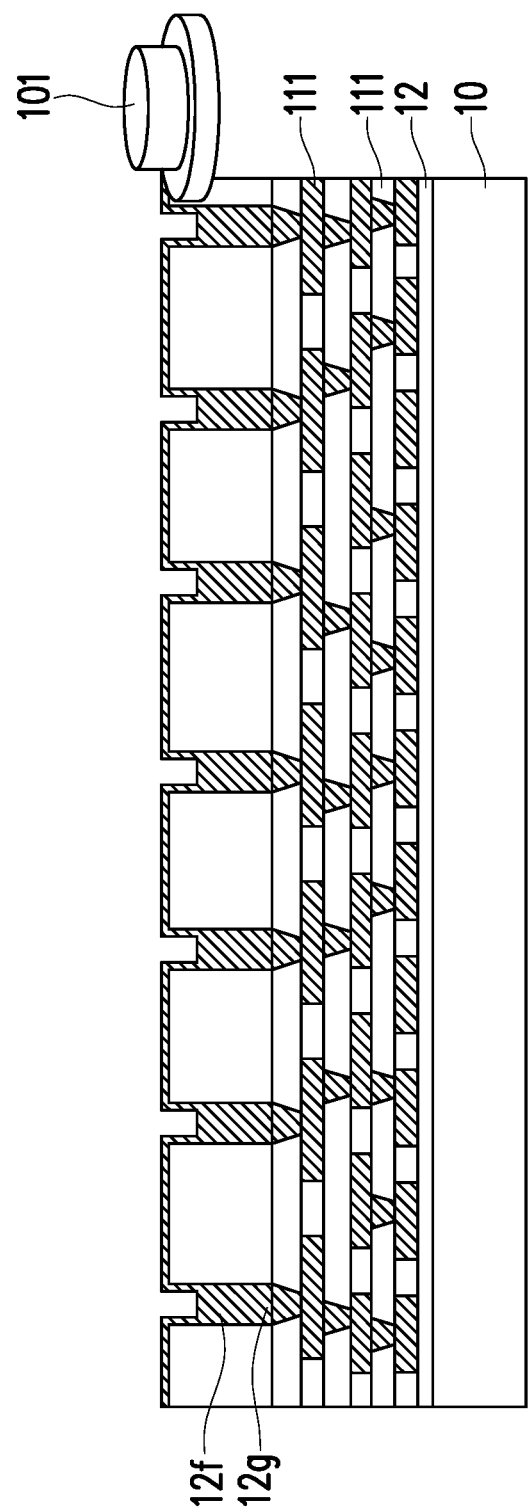
Figure 1M:
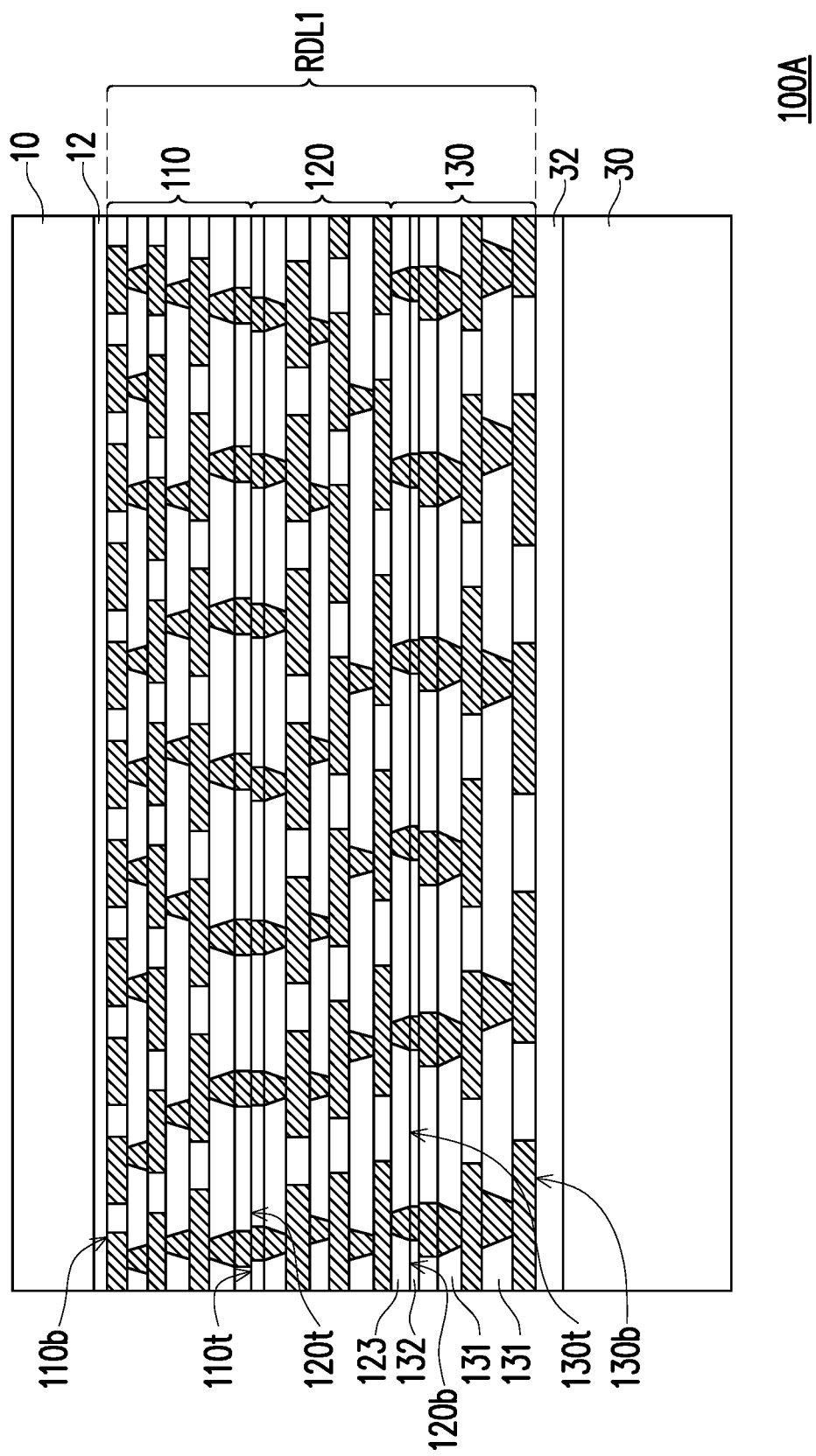
Figure 10:
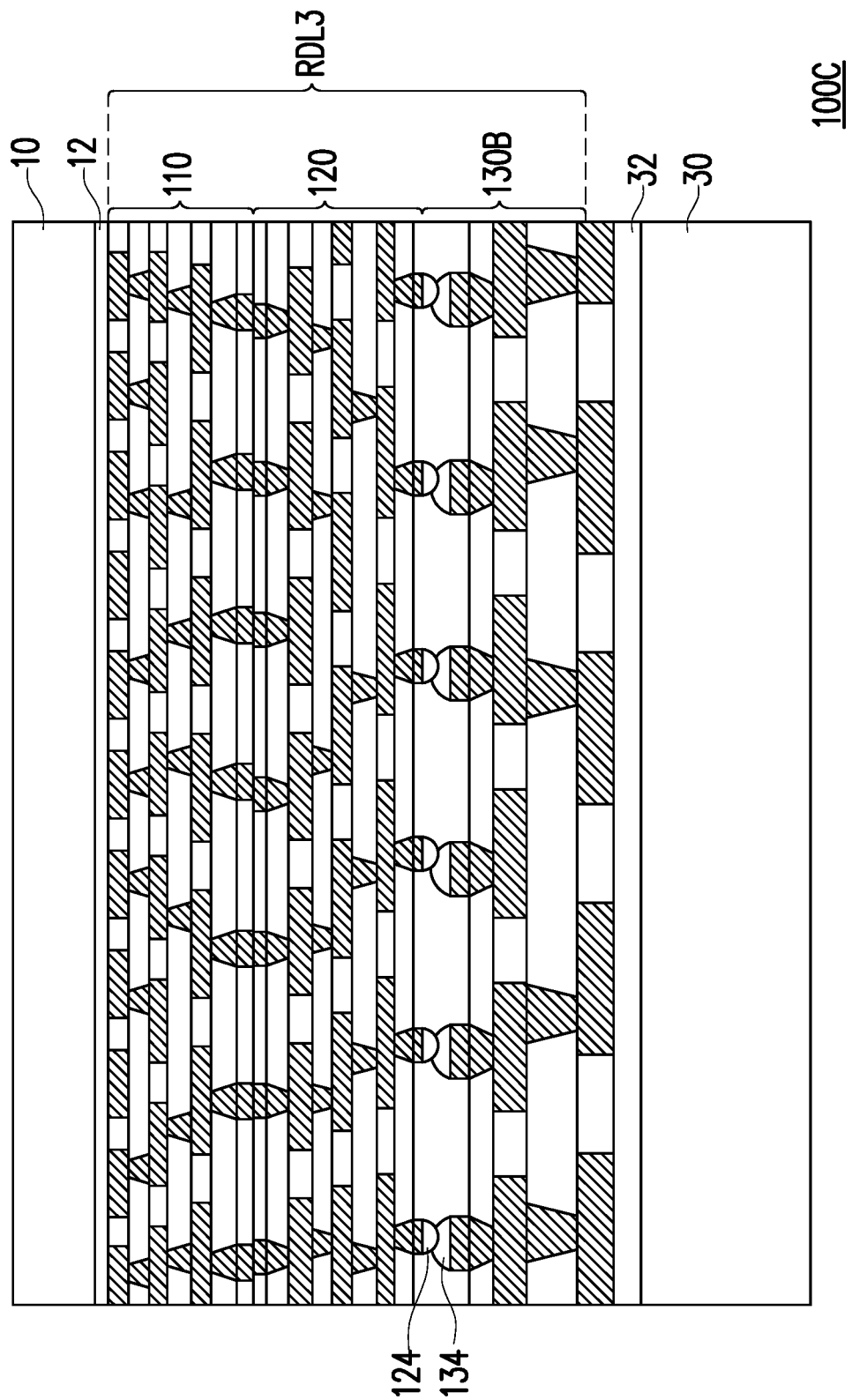
Figure 1P:
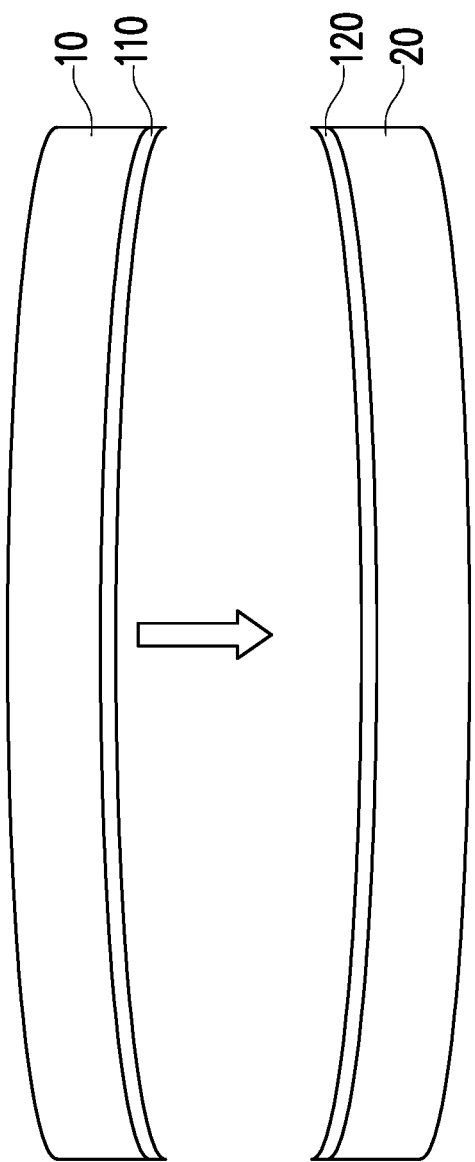
FIG. 1P is a schematic view illustrating a bonding of a semiconductor substrate structure according to some embodiments of the disclosure.
Figure 1Q:
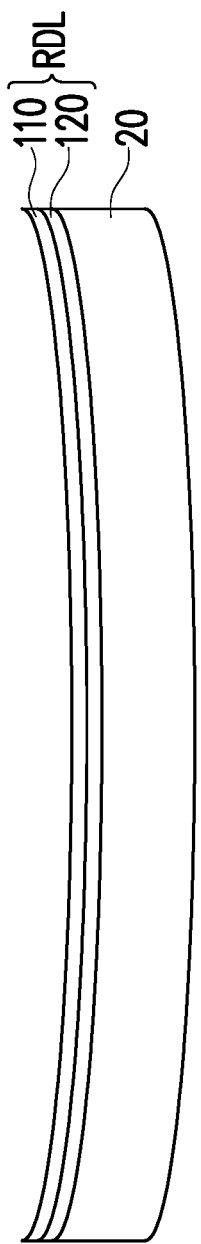
FIG. 1Q is a schematic view illustrating a semiconductor substrate structure after bonding according to some embodiments of the disclosure.
Figure 1R:
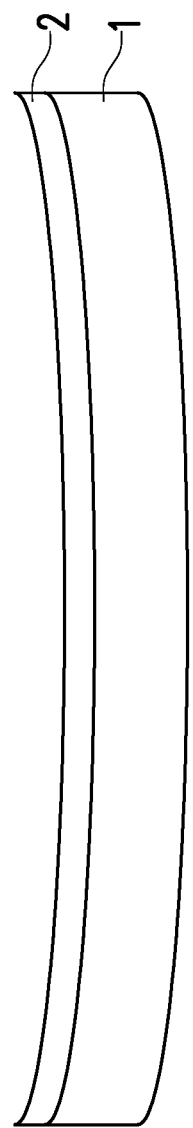
FIG. 1R is a schematic view illustrating a semiconductor substrate structure after bonding of a prior art.

Referring to FIG. 1I, the structure shown in FIG. 1D is flipped upside down. The first group of circuit structure 110 and the second group of circuit structure 120 are directly bonded, so that the first bonding layer 112 is bonded to the second bonding layer 122 to form a multilayer redistribution structure RDL. Through the above manufacturing process, a semiconductor substrate structure 100 of this embodiment has been substantially completed. The semiconductor substrate structure 100 of this embodiment includes a first group of circuit structure 110 and a second group of circuit structure 120. The first group of circuit structure 110 includes multiple first circuit layers 111 and a first bonding layer 112. The second group of circuit structure 120 includes multiple second circuit layers 121 and a second bonding layer 122. The second group of circuit structure 120 is disposed on the first group of circuit structure 110 and is electrically connected to the first group of circuit structure 110. The first bonding layer 112 is bonded to the second bonding layer 122 to form a multilayer redistribution structure RDL. Accordingly, in this embodiment, multiple groups of circuit structure (the first group of circuit structure 110 and the second group of circuit structure 120) are separately manufactured on temporary carriers (the first temporary carrier 10 and the second temporary carrier 20) respectively. Then, multiple groups of circuit structure are directly assembled into the multilayer redistribution structure RDL. In this way, compared with the multilayer redistribution structure produced continuously at one time, the warpage may be effectively reduced. Thus, the semiconductor substrate structure 100 maintains better yield and electrical performance while having multilayer redistribution structure RDL.

Furthermore, due to the limitations of the process, the difficulty is positively related to the number of layers to be produced. Therefore, the more layers to be made, the higher the chance that the entire multilayer redistribution structure is be damaged during the manufacturing process, resulting in ineffective control of yield and cost. In this embodiment, the multilayer redistribution structure RDL is divided into multiple groups of circuit structure with a smaller number of layers, which are produced separately. Thus, the problem of continuous stacking of multiple layers that cannot effectively control the yield and cost may be avoided, but the disclosure is not limited thereto.

In some embodiments, due to a difference between the coefficient of thermal expansion (CTE), warpage occurs, and the more layers are stacked, the more serious the situation is going to be. Therefore, in the case of the multilayer redistribution structure being made continuously at one time, the warpage accumulates and becomes larger, such as the multilayer redistribution structure 2 formed on the temporary carrier 1 as shown in FIG. 1R. In this embodiment, the multilayer redistribution structure RDL is divided into multiple groups of circuit structure (the first group of circuit structure 110 and the second group of circuit structure 120) and then manufactured separately. Thereafter, one of the groups is flipped upside down for bonding (afterwards, a bonding surface may be leveled by applying upward and downward pressure). In this way, stress may be effectively offset due to different warpage directions of upper and lower sides, thereby relieving the warpage, as shown in FIG. 1P and FIG. 1Q. It should be noted that, in FIG. 1Q, the first temporary carrier 10 is not pressurized and is omitted for brevity. The warpage in FIG. 1P to FIG. 1R is merely an exemplary illustration and is not intended to limit the disclosure, and the actual warpage is subject to actual process conditions.

In some embodiments, direct bonding may be performed by Cu to Cu hybrid bonding or Cu to Cu direct bonding, so that the first bonding members 112a is in direct contact with the second bonding members 122a, and the first bonding dielectric layer 112b is in direct contact with the second bonding dielectric layer 122b. The first bonding member 112a and the second bonding member 122a may be bonded in a one-to-one manner, for example, the first bonding member 112a is substantially aligned with the second bonding member 122a. However, due to the design of the process conditions, the first bonding member 112a may also be substantially partially staggered with the second bonding member 122a. Since no welding material is used for bonding between the first bonding layer 112 and the second bonding layer 122, the connection of the multilayer redistribution structure RDL may be regarded as a solderless connection.

In some embodiments, the finer the line distance/pitch (L/S) (e.g., line width), the more demanding the process requirements are and the more difficulties are encountered in forming a multilayer redistribution structure. However, compared with the continuously formed structures, the method of bonding and assembling multiple groups of circuit structure to make fine line distance/pitch structures in this embodiment has greater advantages in yield and electrical performance. For example, the first group of circuit structure 110 and the second group of circuit structure 120 may both have a fine line distance/pitch of at least less than 10 micrometers. Thus, after the first group of circuit structure 110 and the second group of circuit structure 120 are directly bonded and assembled, a multilayer redistribution structure RDL with fine line distance/pitch is formed, but the disclosure is not limited thereto.

In some embodiments, as shown in FIG. 1I, each of the first circuit layers 111 includes two adjacent first circuits, and a first pitch 111s is provided between center points of the two adjacent first circuits, each of the second circuit layers 121 includes two adjacent second circuits, and a second pitch 121s is provided between center points of the two adjacent second circuits, the first pitch 111s of each of the first circuit layers 111 is smaller than the second pitch 121s of each of the second circuit layers 121, and the pitch of each layer gradually increases from the first group of circuit structure 110 to the second group of circuit structure 120. For example, a direction from the second surface 110b of the first group of circuit structure 110 to the fourth surface 120b of the second group of circuit structure 120 which passes through the first surface 110t of the first group of circuit structure 110 and the third surface 120t of the second group of circuit structure 120. The first surface 110t is bonded to the third surface 120t. The first pitch 111s and the second pitch 121s are minimum pitches of each layer, but the disclosure is not limited thereto. In other embodiments, the first pitch 111s and the second pitch 121s may be an average pitch of each layer.

FIG. 4A is a partial schematic cross-sectional view illustrating a pitch of a circuit structure. FIG. 4B is a partial schematic top view corresponding to FIG. 4A. Furthermore, as shown in FIG. 4A and FIG. 4B, a fine pitch F and a thick pitch C may be provided in the circuit layer, and the pitch may be, for example, a distance between center points of two adjacent circuits. For example, the distance between the center points of two adjacent circuits L1 is the fine pitch F, and the distance between the center points of two adjacent circuits L2 is the thick pitch C. Alternatively, the pitch may be a distance between two adjacent pads. For example, the distance between center points of two adjacent pad P1 is the fine pitch F, and the distance between center points of two adjacent pad P2 is the thick pitch C. Thus, the aforementioned first pitch 111s and second pitch 121s may apply these designs according to actual design requirements, which is not limited in the disclosure.

In some embodiments, in the case that the first bonding dielectric layer 112b and the second bonding dielectric layer 122b are two-stage curing materials (e.g., polyimide), in the aforementioned bonding process, heat and/or force is applied to the first bonding layer 112 and the second bonding layer 122. For example, a temperature greater than a glass transition temperature (Tg) of the first bonding layer 112 and the second bonding layer 122 may be applied to the bonding interface of the first bonding layer 112 and the second bonding layer 122. Thus, the first bonding dielectric layer 112b and the second bonding dielectric layer 122b change from a half-cured state to a cured state at this stage, so that the bonding force between the first bonding layer 112 and the second bonding layer 122 is enhanced, but the disclosure is not limited thereto.

In some embodiments, a material of the first bonding dielectric layer 112b and a material of the second bonding dielectric layer 122b may be the same, so substantially no interface is be observed between the first bonding dielectric layer 112b and the second bonding dielectric layer 122b, but the disclosure is not limited thereto.

In some embodiments, the first conductive through hole 111c is gradually thicker toward a direction of the first bonding layer 112 (e.g., thicker in width or diameter), and the second conductive through hole 112c is gradually thicker toward a direction of the second bonding layer 122 (e.g., thicker in width or diameter). In other words, the first conductive through hole 111c is tapered toward the direction of the first temporary carrier 10 (e.g., tapered in width or diameter), and the second conductive through hole 112c is tapered toward the direction of the second temporary carrier 20 (e.g., tapered in width or diameter). That is, after the bonding process, a tapered direction of the first conductive through hole 111c is opposite to a tapered direction of the second conductive through hole 112c.

It should be noted that, according to actual application requirements, the first temporary carrier 10 and/or the second temporary carrier 20 may be optionally removed to expose the first conductive pattern 111a and/or the second conductive pattern 121a and electrically connect with other elements. The releasing layer may be peeled off by applying external energy between a bottom surface of the circuit structure and the temporary carrier.

Referring to FIG. 1J to FIG. 1L, in the alternative embodiment, the first bonding layer 112 may use other manufacturing methods. First, a first photosensitive dielectric layer 12d may be formed on the first circuit layers 111. Next, the first photosensitive dielectric layer 12d is patterned by a lithographic tool such as a stepper and the first photosensitive dielectric layer 12d is cured to form multiple openings 12e exposing the first circuit layer 111 below, as shown in FIG. 1J. Next, a first seed crystal layer 12f is formed to cover the first patterned photosensitive dielectric layer 12d, and the openings 12e are filled by a part of the first seed crystal layer 12f, as shown in FIG. 1K. Thereafter, a first metal layer 12g is formed by performing an electroplating process. Top surfaces of a first bonding member 112a and a first bonding dielectric layer 112b are a coplanar formed by performing a planarization process with a grinding wheel 101. It should be noted that, for the sake of brevity, the second bonding layer 122 may be formed using a manufacturing method similar to the above, which is not shown here. For example, a second photosensitive dielectric layer is formed on the second circuit layers 122. The second photosensitive dielectric layer is patterned and the second photosensitive dielectric layer is cured to form the openings exposing the second circuit layer 122 below. A second seed crystal layer is formed to cover the second patterned photosensitive dielectric layer, and the openings are filled by a part of the second seed crystal layer. A second metal layer is formed by performing an electroplating process. Top surfaces of a second bonding member 122a and a second bonding dielectric layer 122b are a coplanar formed by performing a planarization process with a grinding wheel 101.

In some embodiments, a material of the first seed crystal layer 12f is, for example, Ti (which a thickness of, for example, 0.1 micrometer)/Cu (with a thickness of, for example, 0.3 micrometer). A material of the first metal layer 12g is, for example, Cu, but the disclosure is not limited thereto.

In some embodiments, a number of groups of circuit structure may not be limited to two groups. For example, the multilayer redistribution structure RDL1 of the semiconductor substrate structure 100A shown in FIG. 1M may further include a third group of circuit structure 130, the third group of circuit structure 130 includes multiple third circuit layers 131 and a third bonding layer 132. Furthermore, the second group of circuit structure 120 is disposed between the first group of circuit structure 110 and the third group of circuit structure 130 and are electrically connected with each other. The second group of circuit structure 120 includes another bonding layer 123 relative to the first group of circuit structure, and the another bonding layer 123 is bonded to the third bonding layer 132 to form a multilayer redistribution structure. In addition, the third group of circuit structure 130 includes a fifth surface 130t and a sixth surface 130b opposite to each other.

In addition, the semiconductor substrate structure 100A may be a continuation of FIG. 1H, with the second temporary carrier 20 and the second releasing layer 22 removed, the third group of circuit structure 130 on the third temporary carrier 30 and the third releasing layer 32 are bonded to the second group of circuit structure 110 to form a multilayer redistribution structure RDL1, but the disclosure is not limited thereto.

In some embodiments, a number of the first circuit layer 111 of the first group of circuit structure 110 (six-layer structure) is the same as a number of the second circuit layer 121 of the second group of circuit structure 120 (six-layer structure), but different embodiments may also be provided. For example, in the semiconductor substrate structure 100A shown in FIG. 1M, the number of the first circuit layer 111 of the first group of circuit structure 110 and the number of the second circuit layer 121 of the second group of circuit structure 120 are different from a number of the third group of circuit structure 130 (five-layer structure), the aforementioned difference in number may be one layer or two layers, but the disclosure is not limited thereto.

In some embodiments, a thickness of the first circuit layer 111 of the first group of circuit structure 110 (six-layer structure) is the same as a thickness of the second circuit layer 121 of the second group of circuit structure 120 (six-layer structure), but different embodiments may also be provided. For example, in the semiconductor substrate structure 100B shown in FIG. 1N, the thickness of the first circuit layer 111 of the first group of circuit structure 110 and the thickness of the second circuit layer 121 of the second group of circuit structure 120 are different from a thickness of a third group of circuit structure 130B. The thickness of the third group of circuit structure 130B may be twice the thickness of the first circuit layer 111 or the thickness of the second circuit layer 121 of the second group of circuit structure 120 to form a multilayer redistribution structure RDL2. In addition, in this embodiment, the second group of circuit structure 120 and the third group of circuit structure 130B are bonded using Cu to Cu hybrid bonding or Cu to Cu direct bonding, but the disclosure is not limited thereto. In other embodiments, such as the semiconductor substrate structure 100C shown in FIG. 1O, solder 124 and solder 134 may be used for bonding between the second group of circuit structure 120 and the third group of circuit structure 130B to form a multilayer redistribution structure RDL3, but the disclosure is not limited thereto.

In some embodiments, as shown in FIG. 1M and FIG. 1N, each of the third circuit layers 131 of the third group of circuit structure includes two adjacent second circuits, and a third pitch 131s is provided between center points of the two adjacent third circuits, the third pitch 131s is greater than the first pitch 111s and the second pitch 121s, and the pitch of each layer gradually increases from the first group of circuit structure 110 to the third group of circuit structure 130. For example, a direction from the second surface 110b of the first group of circuit structure 110 to the sixth surface 130b of the third group of circuit structure 130 which passes through the first surface 110t of the first group of circuit structure 110, the third surface 120t of the second group of circuit structure 120, the fourth surface 120b of the second group of circuit structure 120, and the fifth surface 130t of the third group of circuit structure 130. The fourth surface 120b is bonded to the fifth surface 130t. In addition, a dielectric coefficient of thermal expansion (CTE) of the third bonding layer 132 is smaller than a dielectric coefficient of thermal expansion of the first bonding layer 112 and a dielectric coefficient of thermal expansion of the second bonding layer 122, but the disclosure is not limited thereto.

It is to be noted that the following embodiments use the reference numerals and a part of the contents of the above embodiment, and the same or similar reference numerals are used to denote the same or similar elements, and the description of the same technical content is omitted. For the description of the omitted part, reference may be made to the above embodiments, and details are not described in the following embodiments.

Figure 2A:
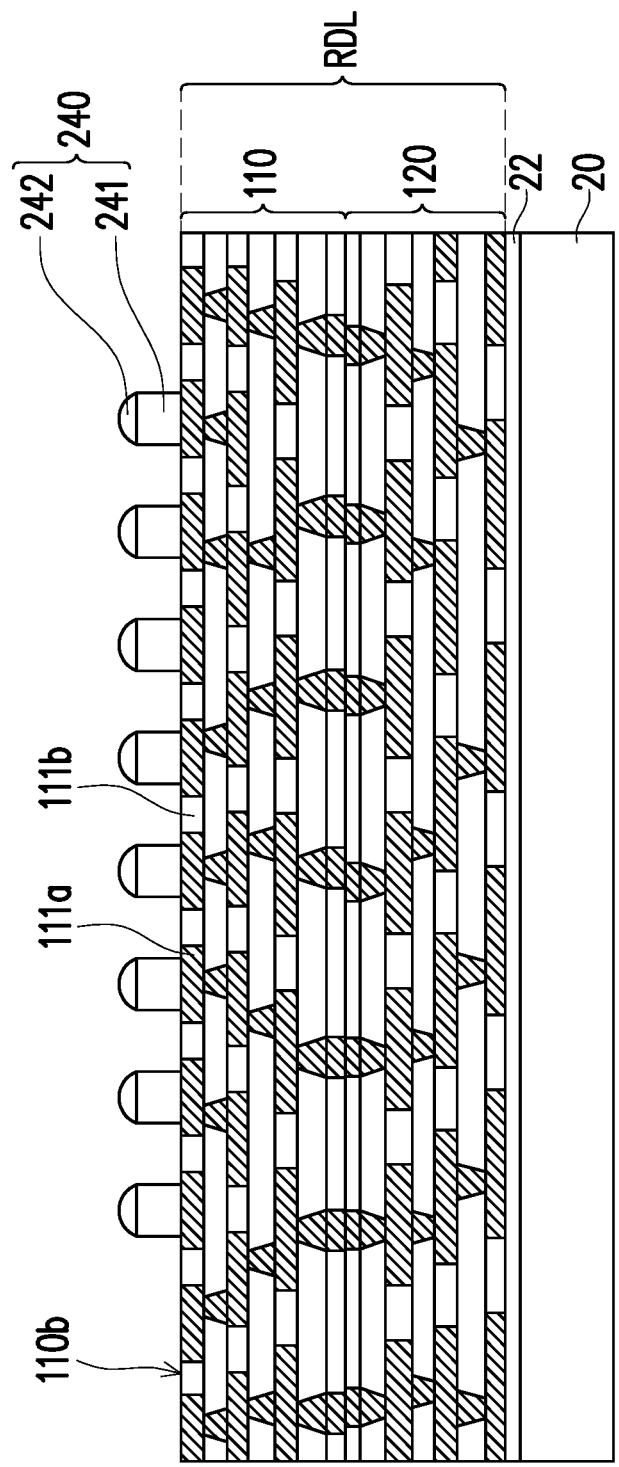

FIG. 2A to FIG. 2D are partial schematic cross-sectional views illustrating a manufacturing method of a semiconductor structure according to some other embodiments of the disclosure. FIG. 2E is a partial manufacturing flowchart of a semiconductor structure according to some embodiments of the disclosure. FIG. 2F is a partial schematic cross-sectional view illustrating a semiconductor structure according to some embodiments of the disclosure. Referring to FIG. 2A and FIG. 2E, as a continuation of FIG. 1E, after the first group of circuit structure and the second group of circuit structure are assembled (step S110), the first temporary carrier is removed by a first releasing layer (step S120). For example, the manufacturing method of the semiconductor substrate structure may further remove the first releasing layer 12 and the first temporary carrier 10 (e.g., by a laser process, and the remaining first releasing layer 12 may be removed by plasma process) to expose the first conductive pattern 111a and the first dielectric layer 111b (which may be regarded as a chip end of the multilayer redistribution structure RDL) of the second surface 110b of the first group of circuit structure 110. Next, after removing the first temporary carrier 10, multiple conductive connecting members are formed on the first group of circuit structure (step S130). For example, multiple conductive connecting members 240 may be formed on the first conductive pattern 111a of the second surface 110b of the first group of circuit structure 110. The conductive connecting members 240 includes a conductive pillar 241 and a conductive cap 242 formed thereon. The conductive pillar 241 may be made of copper, and the conductive cap 242 may be made of solder, but the disclosure is not limited thereto. The conductive pillar 241 and the conductive cap 242 may also be made of other suitable materials. For example, the conductive cap 242 may be a Sn/Ag lead-free solder. Through the above manufacturing process, another semiconductor substrate structure for electrically connecting the semiconductor chip and the external terminal may be completed, but the disclosure is not limited thereto.

In some embodiments, adjacent conductive connecting members 240 may have fine pitches to correspond to chips to be mounted later, but the disclosure is not limited thereto.

Figure 2B:
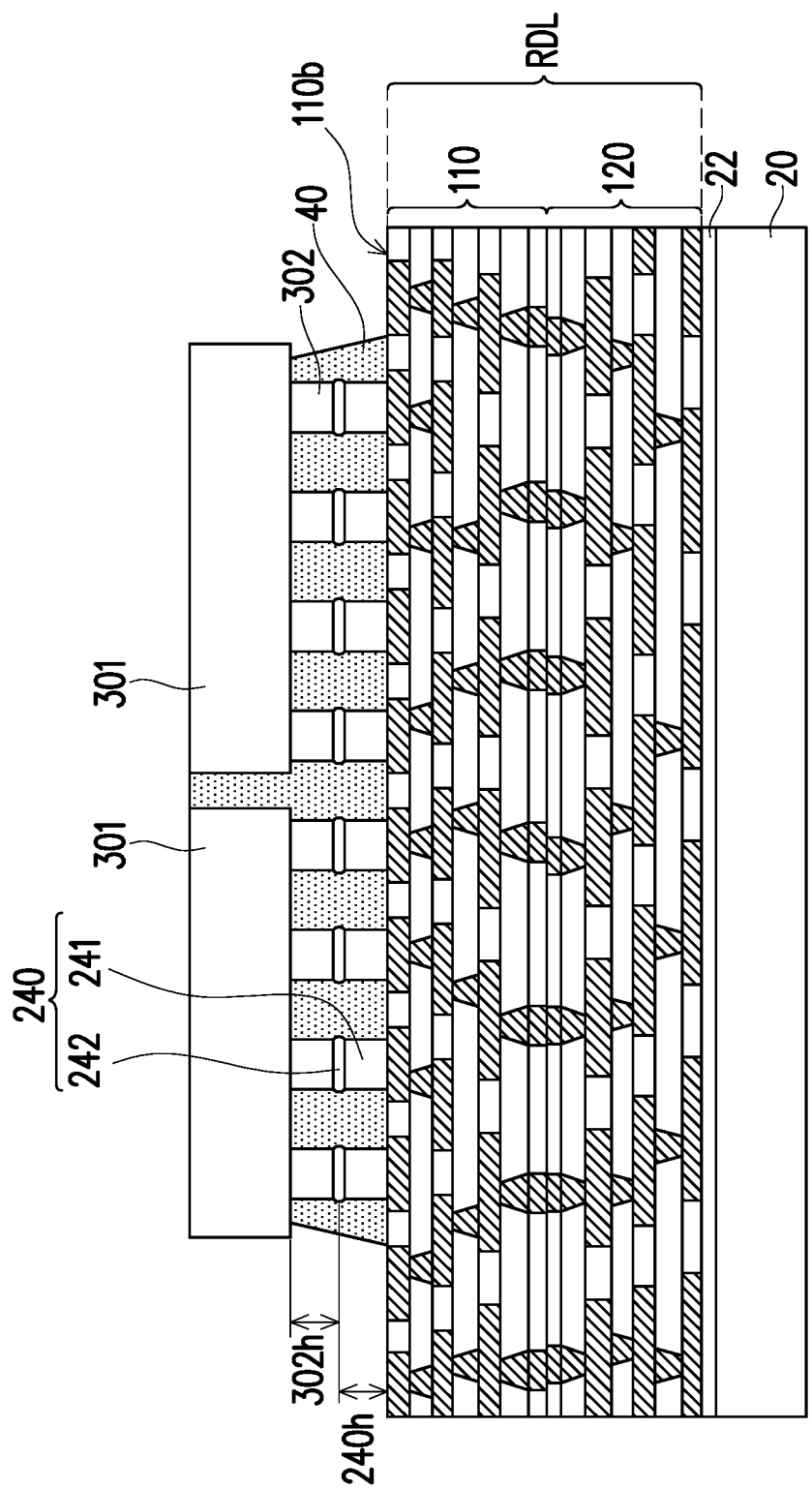
Figure 2D:
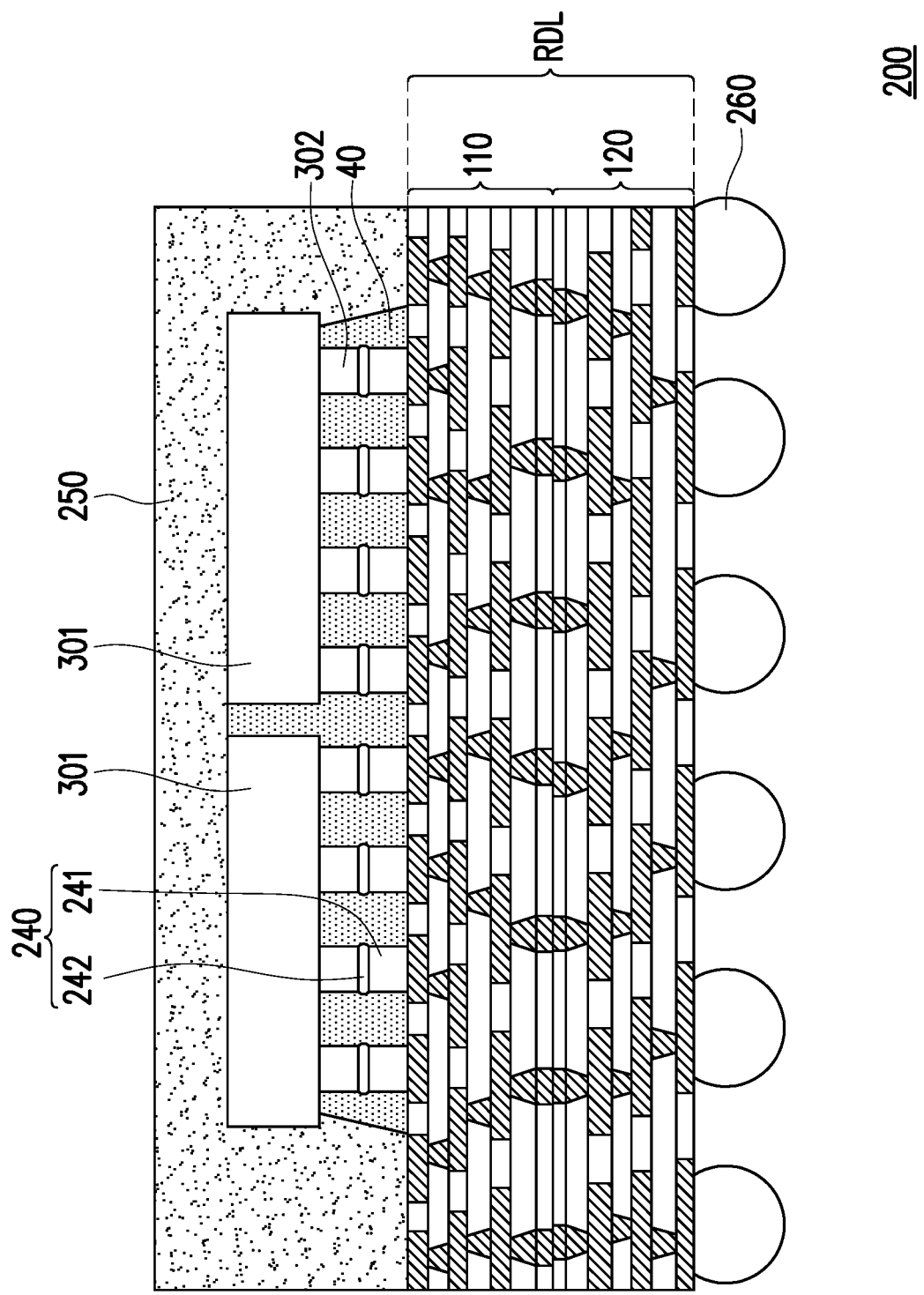
Figure 2E:
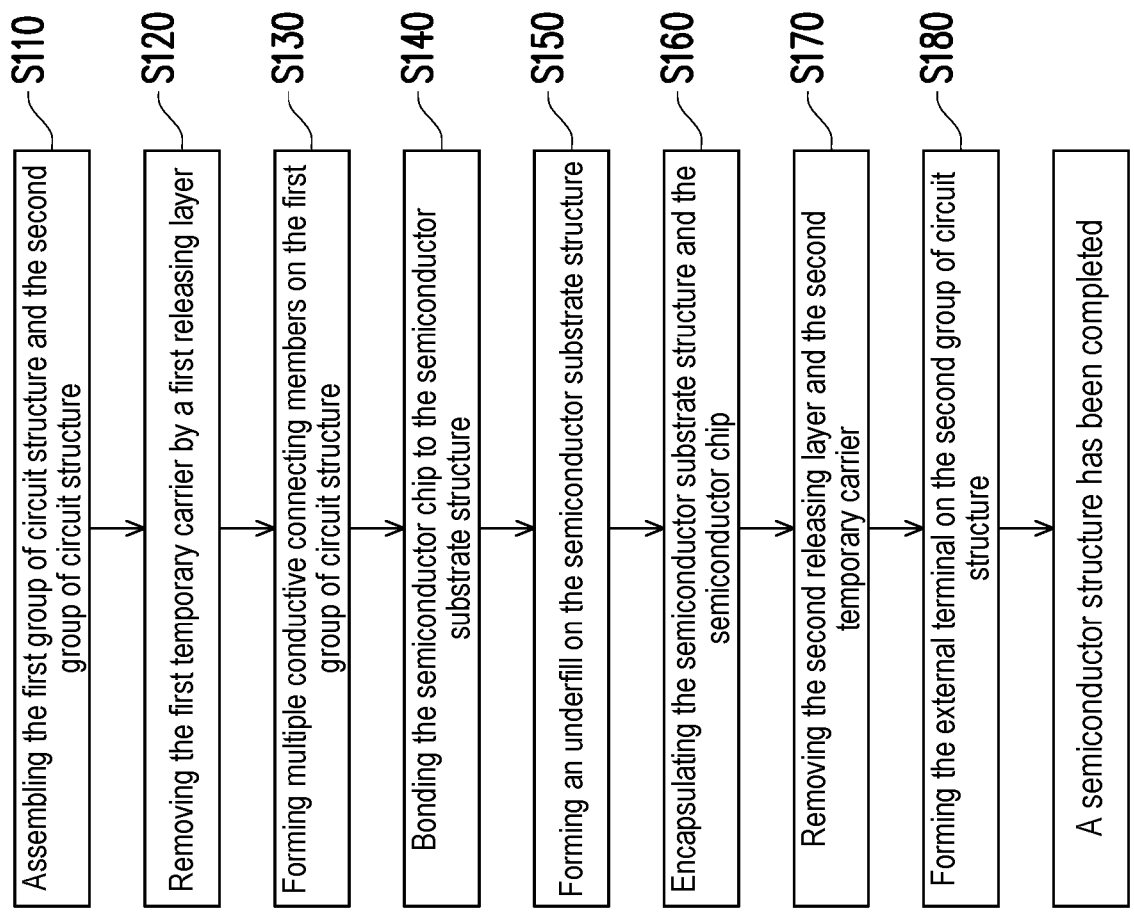
FIG. 2E is a partial manufacturing flowchart of a semiconductor structure according to some embodiments of the disclosure.
Figure 2F:
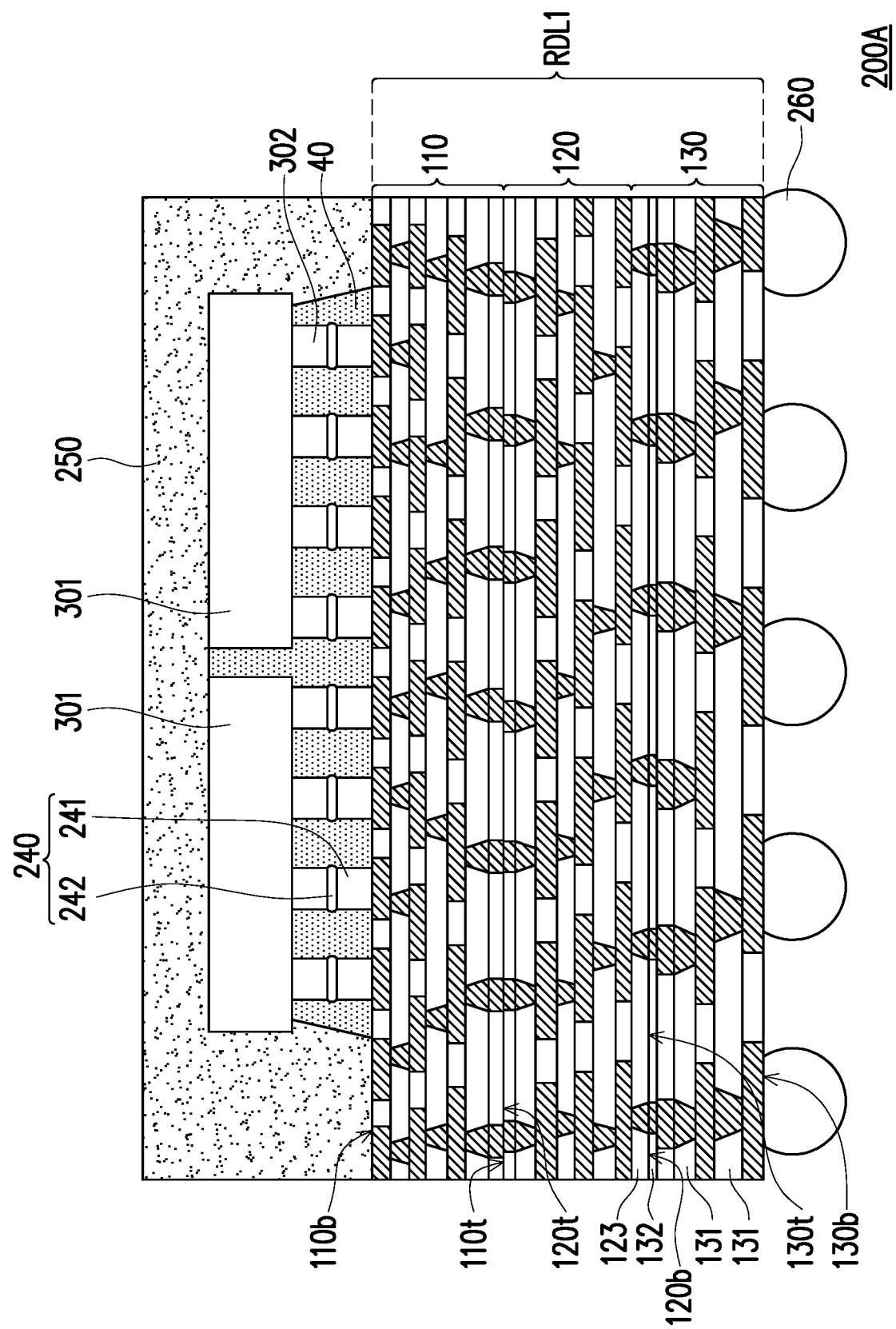
FIG. 2F is a partial schematic cross-sectional view illustrating a semiconductor structure according to some embodiments of the disclosure.

Referring to FIG. 2B and FIG. 2E, the semiconductor chip is bonded to the semiconductor substrate structure (step S140). For example, a semiconductor chip 301 may be connected to the second surface 110b of the first group of circuit structure 110 using, for example, flip chip bonding. For example, a conductive bump 302 of the semiconductor chip 301 (which may further include solder) may be bonded to the conductive cap 242 of the conductive connecting member 240. In other words, the conductive bump 302 of the semiconductor chip 301 may be in direct contact with the conductive cap 242 of the conductive connecting member 240 to form a heterogeneous integration module or system. Furthermore, the semiconductor chip 301 may be bonded to the second group of circuit structure 120 by thermal compression bonding.

In some embodiments, the semiconductor chip 301 is, for example, a logic chip, a memory chip, a three-dimensional integrated circuit (3DIC) chip (e.g., a high bandwidth memory chip), and/or the like. The 3DIC chip includes multiple layers stacked on each other, and silicon vias (TSVs) are formed to provide vertical electrical connection between the layers, but the disclosure is not limited thereto.

In some embodiments, a height 302h of the conductive bump 302 may be greater than a height 240h of the corresponding conductive connecting member 240, but the disclosure is not limited thereto. The height 302h of the conductive bump 302 and the height 240h of the conductive connecting member 240 may be determined according to actual design requirements.

In some embodiments, an underfill is formed on the semiconductor substrate structure (step S150). For example, an underfill 40 may be formed on the second surface 110b of the first group of circuit structure 110 to fill the gap between the second surface 110b and the semiconductor chip 301, thereby enhancing the reliability of the flip chip bonding. In some embodiments, more than one semiconductor chip 301 performing the same or different functions may be provided on the first group of circuit structure 110. In this case, the semiconductor chips 301 may be electrically connected to the first group of circuit structure 110 and to each other through the first group of circuit structure 110. The number of semiconductor chips 301 disposed on the first group of circuit structure 110 does not constitute limitation to the disclosure.

Referring to FIG. 2C and FIG. 2E, the semiconductor substrate structure and the semiconductor chip are encapsulated (step S160). For example, a sealing body 250 is formed on the second surface 110b of the first group of circuit structure 110 to encapsulate the semiconductor chip 301 and the underfill 40. The sealing body 250 may be a molding compound formed by a molding process. The sealing body 250 may be formed of an insulating material such as epoxy resin or other suitable resins, but the disclosure is not limited thereto.

Referring to FIG. 2D and FIG. 2E, the second releasing layer and the second temporary carrier are removed (step S170). For example, the second releasing layer 22 and the second temporary carrier 20 are removed to expose the second conductive pattern 121a and the second dielectric layer 121b of the fourth surface 120b of the second group of circuit structure 120 (which may be regarded as a terminal end of the multilayer redistribution structure RDL). Thereafter, the external terminal is formed on the second group of circuit structure (step S180). For example, a bottom connection pad may be formed by metallization on the second conductive pattern 121a, and solder may be formed on the bottom connection pad, so as to form multiple external terminals 260 on the terminal end of the multilayer redistribution structure RDL. The second group of circuit structure 120 is disposed between the external terminal 260 and the first group of circuit structure 110, and the external terminal 260 is electrically connected to the second group of circuit structure 120. Through the above manufacturing process, a semiconductor structure 200 of this embodiment has been substantially completed.

In some embodiments, as shown in FIG. 2F, after removing the second releasing layer 22 and the second temporary carrier 20, a third group of circuit structure 130 may be further formed, and then the external terminal is formed on the third group of circuit structure 130 to complete the semiconductor structure 200A. Details of material and formation method of the third group of circuit structure 130 are similar to those described in FIG. 1M and FIG. 2D, and details are not repeated herein.

In some embodiments, the external terminal 260 may be a solder ball, and may be formed using a balling process to be placed on the second conductive pattern 121a of the second group of circuit structure 120. A soldering process and a reflow process may be selectively performed to enhance the adhesion between the external terminal 260 and the second conductive pattern 121a, but the disclosure is not limited thereto.

In a not-shown embodiment, the semiconductor structure 200 may be further disposed on a circuit carrier (e.g., a printed circuit board (PCB), a system board, a motherboard), a package and/or other elements to form an electronic device. For example, the external terminal 260 is disposed on the circuit carrier, and the semiconductor chip 301 is electrically connected to the circuit carrier or other elements in the circuit carrier through the multilayer redistribution structure RDL, but the disclosure is not limited thereto.

In some embodiments, the semiconductor structure 200 is a wafer level semiconductor packaging structure, but the disclosure is not limited thereto.

FIG. 3A is a partial schematic cross-sectional view illustrating a semiconductor structure according to some other embodiments of the disclosure. FIG. 3B and FIG. 3C are partial schematic cross-sectional views illustrating some specific embodiments of the connecting layer of FIG. 3A. Referring to FIG. 3A, compared with the semiconductor structure 200 of FIG. 2D, the semiconductor structure 300 of this embodiment further includes a connecting layer 370 and a substrate 380 between the multilayer redistribution structure RDL and the external terminal 260. The multilayer redistribution structure RDL is coupled to the substrate 380 through the connecting layer 370 (the multilayer redistribution structure RDL and the substrate 380 may be collectively referred to as a 2.2D integrated substrate). The substrate 380 may be a ceramic substrate, a laminated organic substrate, a packaged substrate, an integrated substrate, or the like.

In some embodiments, the connecting layer 370 may connect with other elements by using solder. For example, as shown in FIG. 3B, the connecting layer 370 may include a copper pad 371 (which may also be a copper pillar) in direct contact with the multilayer redistribution structure RDL, a copper pad 372 in direct contact with the substrate 380, and a solder 373 disposed between the copper pad 371 and the copper pad 372. A surface of the copper pad 372 may be composed of Cu/Ni/Au and may also be surrounded by a solder mask 374 to improve electrical performance, but the disclosure is not limited thereto. Solderless connections may also be used between the connecting layer 370 and other elements. For example, as shown in FIG. 3C, a connection method of the connecting layer 370 is, for example, hybrid bonding or Cu to Cu direct bonding. The connecting layer 370 may include the copper pad 371 in direct contact with the multilayer redistribution structure RDL and the copper pad 372 in direct contact with the substrate 380. The copper pad 371 and the copper pad 372 may be in direct contact with and bonded together, but the disclosure is not limited thereto.

In some embodiments, the substrate 380 includes a core layer 381, a build-up structure 382, and multiple vias 381a. The build-up structure 382 is respectively formed on two sides of the core layer 381, and the vias 381a penetrate through the core layer 381 to electrically connect the build-up structure 382 on both sides. The build-up structure 382 includes a conductive pattern 382a embedded in the dielectric layer, but the disclosure is not limited thereto. In a not-shown embodiment, the substrate 380 may not have the core layer 381.

Figure 5A:
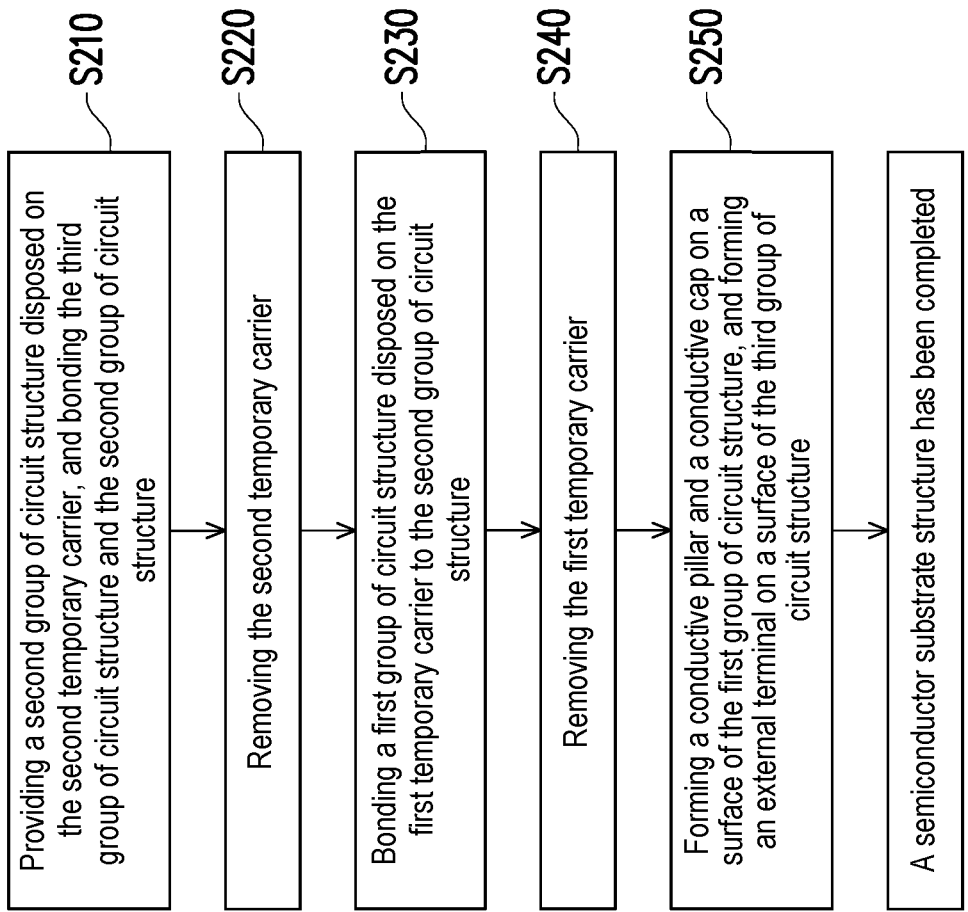
FIG. 5A is a partial manufacturing flowchart of a semiconductor substrate structure according to some embodiments of the disclosure.
Figure 5B:
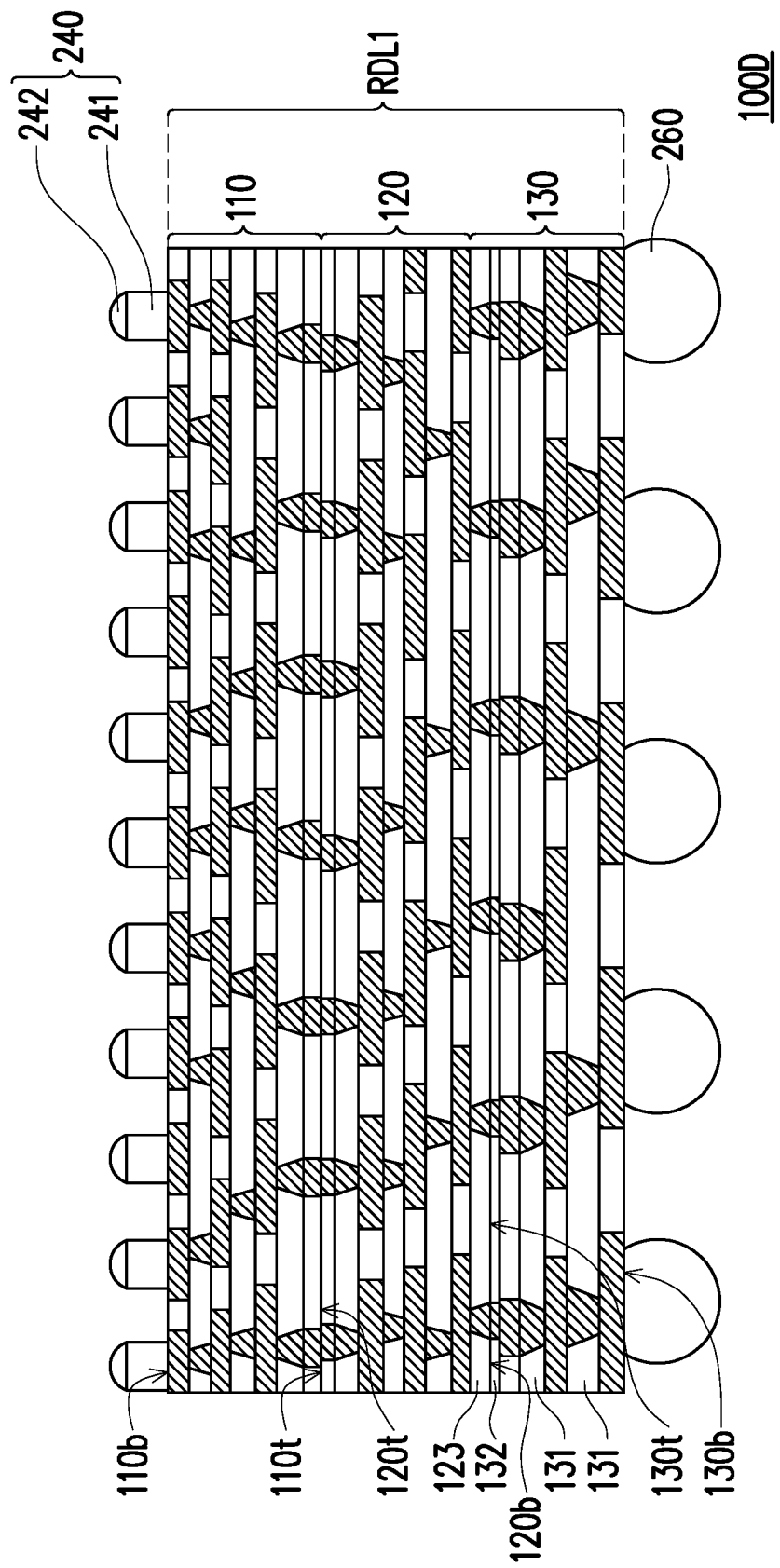
FIG. 5B is a partial schematic cross-sectional view illustrating a semiconductor substrate structure according to some embodiments of the disclosure.

FIG. 5A is a partial manufacturing flowchart of a semiconductor substrate structure according to some embodiments of the disclosure. FIG. 5B is a partial schematic cross-sectional view illustrating a semiconductor substrate structure according to some embodiments of the disclosure. Referring to FIG. 2A, FIG. 2F, FIG. 5A, and FIG. 5B, the semiconductor substrate structure 100D of this embodiment may have different manufacturing method which includes the following steps. A second group of circuit structure disposed on the second temporary carrier is provided, and the third group of circuit structure and the second group of circuit structure are bonded (step S210). The second temporary carrier is removed (step S220). A first group of circuit structure disposed on the first temporary carrier is bonded to the second group of circuit structure (step S230). The first temporary carrier is removed (step S240). A conductive pillar and a conductive cap are formed on a surface of the first group of circuit structure, and an external terminal is formed on a surface of the third group of circuit structure (step S250). Through the above manufacturing process, a semiconductor structure 100D of this embodiment has been substantially completed.

In this embodiment, the manufacturing method of the semiconductor structure 100D may also correspond to the following steps. A second group of circuit structure is formed on a second temporary carrier. A third group of circuit structure is formed on the second group of circuit structure. The second group of circuit structure and the third group of circuit structure are bonded. The second temporary carrier is removed. A first group of circuit structure is formed on a first temporary carrier. The first group of circuit structure and the second group of circuit structure are directly bonded. The first temporary carrier is removed. A conductive pillar and a conductive cap are formed on a surface of the first group of circuit structure, and an external terminal is formed on a surface of the third group of circuit structure.

In this embodiment, the semiconductor structure 100D includes a multilayer redistribution structure RDL1 formed by a first group of circuit structure 110, a second group of circuit structure 120, and a third group of circuit structure 130. The conductive pillar 241 and the conductive cap 242 are formed on the second surface 110b of the first group of circuit structure 110. The external terminal 260 is formed on the sixth surface 130b of the third group of circuit structure 130. The third group of circuit structure 130 is not disposed on a temporary carrier during manufacturing process and is a plate-like structure with support, but the disclosure is not limited thereto. The same or similar reference numerals are used to denote the same or similar elements, so details may be referred to the foregoing embodiments and are not repeated herein.

It should be noted that the different embodiment described above may be combined in different ways, and it is not a limitation of this case. As long as multiple groups of circuit structure are individually manufactured and then assembled into a multilayer redistribution structure, they all belong to the protection scope of the disclosure. In addition, temporary carriers (e.g., the first temporary carrier, the second temporary carrier, the third temporary carrier, or other temporary carriers used in the process) form no part of the final structure.

To sum up, the disclosure first separately manufactures multiple groups of circuit structure on the temporary carrier, and then bonds and assembles the aforementioned multiple groups of circuit structure into a multilayer redistribution structure. In this way, compared with the multilayer redistribution structure produced continuously at one time, the warpage may be effectively reduced. Thus, the semiconductor substrate structure maintains better yield and electrical performance while having multilayer redistribution structure.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:
1. A semiconductor substrate structure, comprising:
  a first circuit structure, comprising a plurality of first circuit layers and a first bonding layer; and
  a second circuit structure, comprising a plurality of second circuit layers and a second bonding layer, wherein the second circuit structure is disposed on the first circuit structure and is electrically connected to the first circuit structure, and the first bonding layer is bonded to the second bonding layer to form a multilayer redistribution structure.
2. The semiconductor substrate structure according to claim 1, wherein the first bonding layer comprises a plurality of first bonding members and a first bonding dielectric layer, and the second bonding layer comprises a plurality of second bonding members and a second bonding dielectric layer, the first bonding members are in direct contact with the second bonding members, and the first bonding dielectric layer is in direct contact with the second bonding dielectric layer.

3. The semiconductor substrate structure according to claim 1, wherein a dielectric layer in the first circuit structure and a dielectric layer in the second circuit structure are organic thin films.

4. The semiconductor substrate structure according to claim 1, wherein a material of a dielectric layer in the first circuit structure and a material of a dielectric layer in the second circuit structure are the same.

5. The semiconductor substrate structure according to claim 1, wherein a material of a dielectric layer in the first circuit structure and a material of a dielectric layer in the second circuit structure are different.

6. The semiconductor substrate structure according to claim 1, wherein each of the first circuit layers comprises two adjacent first circuits, and a first pitch is provided between center points of the two adjacent first circuits, each of the second circuit layers comprises two adjacent second circuits, and a second pitch is provided between center points of the two adjacent second circuits, the first pitch of each of the first circuit layers is smaller than the second pitch of each of the second circuit layers, and the first circuit structure comprises a first surface and an opposing second surface, the second circuit structure comprises a third surface and an opposing fourth surface, and the first surface is bonded to the third surface.

7. The semiconductor substrate structure according to claim 3, wherein a first pitch and a second pitch are minimum pitches of each layer.

8. The semiconductor substrate structure according to claim 1, wherein a number of the first circuit layers of the first circuit structure is the same as a number of the second circuit layers of the second circuit structure.

9. The semiconductor substrate structure according to claim 1, wherein a number of the first circuit layers of the first circuit structure is different from a number of the second circuit layers of the second circuit structure.

10. The semiconductor substrate structure according to claim 9, wherein the number of the first circuit layers of the first circuit structure and the number of the second circuit layers of the second circuit structure are one layer or two layers.

11. A semiconductor substrate structure, comprising:
a first circuit structure, comprising a plurality of first circuit layers and a first bonding layer;
a second circuit structure, comprising a plurality of second circuit layers and a second bonding layer, wherein the second circuit structure is disposed on the first circuit structure and is electrically connected to the first circuit structure, and the first bonding layer is bonded to the second bonding layer; and
a third circuit structure, comprising a plurality of third circuit layers and a third bonding layer, wherein the second circuit structure is disposed between the first circuit structure and the third circuit structure and are electrically connected with each other, and the second circuit structure comprises another bonding layer relative to the first circuit structure, and the another bonding layer is bonded to the third bonding layer to form a multilayer redistribution structure.

12. The semiconductor substrate structure according to claim 11, wherein a dielectric layer in the first circuit structure and a dielectric layer in the second circuit structure are organic thin films.

13. The semiconductor substrate structure according to claim 11, wherein a material of a dielectric layer in the first circuit structure and a material of a dielectric layer in the second circuit structure are the same.

14. The semiconductor substrate structure according to claim 11, wherein a material of a dielectric layer in the first circuit structure and a material of a dielectric layer in the second circuit structure are different.

15. The semiconductor substrate structure according to claim 11, wherein a number of the first circuit layers of the first circuit structure is the same as a number of the second circuit layers of the second circuit structure.

16. The semiconductor substrate structure according to claim 11, wherein a number of the first circuit layers of the first circuit structure is different from a number of the second circuit layers of the second circuit structure.

17. The semiconductor substrate structure according to claim 16, wherein the number of the first circuit layers of the first circuit structure and the number of the second circuit layers of the second circuit structure are one layer or two layers.

18. The semiconductor substrate structure according to claim 11, wherein a coefficient of thermal expansion of the third bonding layer is smaller than a coefficient of thermal expansion of the first bonding layer and a coefficient of thermal expansion of the second bonding layer.

19. The semiconductor substrate structure according to claim 11, wherein a thickness of the third circuit structure is greater than a thickness of the first circuit structure and a thickness of the second circuit structure, the third circuit structure comprises a plurality of third circuit layers and a third bonding layer, each of the first circuit layers comprises two adjacent first circuits, and a first pitch is provided between center points of the two adjacent first circuits, each of the second circuit layers comprises two adjacent second circuits, and a second pitch is provided between center points of the two adjacent second circuits, each of the third circuit layers comprises two adjacent third circuits, and a third pitch is provided between center points of the two adjacent third circuits, the third pitch is greater than the first pitch and the second pitch, the first circuit structure comprises a first surface and an opposing second surface, the second circuit structure comprises a third surface and an opposing fourth surface, the third circuit structure comprises a fifth surface and an opposing sixth surface, the first surface is bonded to the third surface, the fourth surface is bonded to the fifth surface, a direction from the second surface to the sixth surface passes through the first surface, the third surface, the fourth surface, and the fifth surface.

20. A manufacturing method of a semiconductor substrate structure, comprising:
forming a first circuit structure on a first temporary carrier, wherein the first circuit structure comprises a plurality of first circuit layers and a first bonding layer;
forming a second circuit structure on a second temporary carrier, wherein the second circuit structure comprises a plurality of second circuit layers and a second bonding layer; and
directly bonding the first circuit structure and the second circuit structure, so that the first bonding layer is bonded to the second bonding layer.

21. The manufacturing method of the semiconductor substrate structure according to claim 20, wherein the direct bonding is performed by Cu to Cu hybrid bonding or Cu to Cu direct bonding.

22. The manufacturing method of the semiconductor substrate structure according to claim 20, wherein forming the first bonding layer further comprises:
- forming a first micro bump on the first circuit layers;
- forming a first connecting bump on the first micro bump;
- forming a first bonding dielectric material layer to cover the first micro bump and the first connecting bump; and
- forming a first bonding member and a first bonding dielectric layer by performing a planarization process.

23. The manufacturing method of the semiconductor substrate structure according to claim 20, wherein a planarization process is performed with a grinding wheel until a top surface of a first connecting bump is exposed, so that top surfaces of a first bonding member and a first bonding dielectric layer are coplanar.

24. The manufacturing method of the semiconductor substrate structure according to claim 20, wherein the forming the second bonding layer further comprises:
- forming a second micro bump on the second circuit layers;
- forming a second connecting bump on the second micro bump; and
- forming a second bonding dielectric material layer to cover the second micro bump and the second connecting bump.

25. The manufacturing method of the semiconductor substrate structure according to claim 20, wherein a planarization process is performed with a grinding wheel until a top surface of a second connecting bump is exposed, so that top surfaces of a second bonding member and a second bonding dielectric layer of are coplanar.

26. The manufacturing method of the semiconductor substrate structure according to claim 20, wherein forming the first bonding layer further comprises:
- forming a first photosensitive dielectric layer on the first circuit layers;
- patterning the first photosensitive dielectric layer and curing the first photosensitive dielectric layer to form a plurality of openings exposing the first circuit layer below;
- forming a first seed crystal layer to cover the first patterned photosensitive dielectric layer, wherein the openings are filled by a part of the first seed crystal layer; and
- performing a planarization process with a grinding wheel, such that each top-surface of a first bonding member and a top surface of a first bonding dielectric layer are coplanar.

27. The manufacturing method of the semiconductor substrate structure according to claim 20, wherein forming the second bonding layer further comprises:
- forming a second photosensitive dielectric layer on the second circuit layers;
- patterning the second photosensitive dielectric layer and curing the second photosensitive dielectric layer to form a plurality of openings exposing the second circuit layer below;
- forming a second seed crystal layer to cover the second patterned photosensitive dielectric layer, wherein the openings are filled by a part of the second seed crystal layer; and
- forming a second metal layer by performing an electroplating process, and
- performing a planarization process with a grinding wheel, such that each top-surface of a second bonding member and a top surface of a second bonding dielectric layer are coplanar.

28. The manufacturing method of the semiconductor substrate structure according to claim 20, wherein after the first circuit structure and the second circuit structure are assembled, the first temporary carrier is removed by a first releasing layer.

29. The manufacturing method of the semiconductor substrate structure according to claim 28, wherein after removing the first temporary carrier, a plurality of conductive connecting members are formed on the first circuit structure, wherein each of the conductive connecting members comprises a conductive pillar and a conductive cap, and the conductive cap is formed on the conductive pillar.

30. The manufacturing method of the semiconductor substrate structure according to claim 29, wherein the semiconductor substrate structure is configured to dispose a semiconductor chip and an external terminal on two opposite sides, and comprises:
- bonding the semiconductor chip on the semiconductor substrate structure;
- forming an underfill on the semiconductor substrate structure;
- encapsulating the semiconductor substrate structure and the semiconductor chip;
- removing the second temporary carrier by a second releasing layer; and
- forming the external terminal on the second circuit structure.

31. The manufacturing method of the semiconductor substrate structure according to claim 20, wherein a dielectric layer in the first circuit structure and a dielectric layer in the second circuit structure are organic thin films.

32. The manufacturing method of the semiconductor substrate structure according to claim 20, wherein a material of a dielectric layer in the first circuit structure and a material of a dielectric layer in the second circuit structure are the same.

33. The manufacturing method of the semiconductor substrate structure according to claim 20, wherein a material of a dielectric layer in the first circuit structure and a material of a dielectric layer in the second circuit structure are different.

34. The manufacturing method of the semiconductor substrate structure according to claim 20, wherein a number of the first circuit layers of the first circuit structure is the same as a number of the second circuit layers of the second circuit structure.

35. The manufacturing method of the semiconductor substrate structure according to claim 20, wherein a number of the first circuit layers of the first circuit structure is different from a number of the second circuit layers of the second circuit structure.

36. The manufacturing method of the semiconductor substrate structure according to claim 35, wherein the number of the first circuit layers of the first circuit structure and the number of the second circuit layers of the second circuit structure are one layer or two layers.

37. The semiconductor substrate structure according to claim 20, wherein each of the first circuit layers comprises two adjacent first circuits, and a first pitch is provided between center points of the two adjacent first circuits, each of the second circuit layers comprises two adjacent second circuits, and a second pitch is provided between center points of the two adjacent second circuits, the first pitch of each of the first circuit layers is smaller than the second pitch of each of the second circuit layers, and the first circuit structure comprises a first surface and an opposing second surface, the second circuit structure comprises a third surface and an opposing fourth surface, the first surface is bonded to the third surface, and a pitch of each layer is directed from the second surface to the fourth surface and passes through the first surface and the third surface.

38. A manufacturing method of a semiconductor substrate structure, comprising:
forming a first circuit structure on a first temporary carrier, wherein the first circuit structure comprises a plurality of first circuit layers and a first bonding layer;
forming a second circuit structure on a second temporary carrier, wherein the second circuit structure comprises a plurality of second circuit layers and a second bonding layer;
directly bonding the first circuit structure and the second circuit structure, so that the first bonding layer is bonded to the second bonding layer;
forming a third circuit structure on the second circuit structure, wherein the third circuit structure comprises a plurality of third circuit layers and a third bonding layer; and
bonding the second circuit structure and the third circuit structure, wherein the second circuit structure comprises another bonding layer relative to the first circuit structure, and the another bonding layer is bonded to the third bonding layer.

39. The manufacturing method of the semiconductor substrate structure according to claim 38, wherein a thickness of the third circuit structure is greater than a thickness of the first circuit structure and a thickness of the second circuit structure, each of the first circuit layers comprises two adjacent first circuits, and a first pitch is provided between center points of the two adjacent first circuits, each of the second circuit layers comprises two adjacent second circuits, and a second pitch is provided between center points of the two adjacent second circuits, each of the third circuit layers comprises two adjacent third circuits, and a third pitch is provided between center points of the two adjacent third circuits, the third pitch is greater than the first pitch and the second pitch, the first circuit structure comprises a first surface and an opposing second surface, the second circuit structure comprises a third surface and an opposing fourth surface, the third circuit structure comprises a fifth surface and an opposing sixth surface, the first surface is bonded to the third surface, the fourth surface is bonded to the fifth surface, and a direction from the second surface to the sixth surface passes through the first surface, the third surface, the fourth surface, and the fifth surface.

40. The manufacturing method of the semiconductor substrate structure according to claim 38, wherein a coefficient of thermal expansion of the third bonding layer is smaller than a coefficient of thermal expansion of the first bonding layer and a coefficient of thermal expansion of the second bonding layer.

41. The manufacturing method of the semiconductor substrate structure according to claim 38, wherein a dielectric layer in the first circuit structure and a dielectric layer in the second circuit structure are organic thin films.

42. The manufacturing method of the semiconductor substrate structure according to claim 38, wherein a material of a dielectric layer in the first circuit structure and a material of a dielectric layer in the second circuit structure are the same.

43. The manufacturing method of the semiconductor substrate structure according to claim 38, wherein a material of a dielectric layer in the first circuit structure and a material of a dielectric layer in the second circuit structure are different.

44. The manufacturing method of the semiconductor substrate structure according to claim 38, wherein a number of the first circuit layers of the first circuit structure is the same as a number of the second circuit layers of the second circuit structure.

45. The manufacturing method of the semiconductor substrate structure according to claim 38, wherein a number of the first circuit layers of the first circuit structure is different from a number of the second circuit layers of the second circuit structure.

46. The manufacturing method of the semiconductor substrate structure according to claim 45, wherein the number of the first circuit layers of the first circuit structure and the number of the second circuit layers of the second circuit structure are one layer or two layers.

47. A manufacturing method of a semiconductor substrate structure, comprising:
forming a second circuit structure on a second temporary carrier;
forming a third circuit structure on the second circuit structure;
bonding the second circuit structure and the third circuit structure;
removing the second temporary carrier;
forming a first circuit structure on a first temporary carrier;
directly bonding the first circuit structure and the second circuit structure;
removing the first temporary carrier; and
forming a conductive pillar and a conductive cap on a surface of the first circuit structure, and forming an external terminal on a surface of the third circuit structure.

48. The manufacturing method of the semiconductor substrate structure according to claim 47, wherein the third circuit structure is not disposed on a temporary carrier during a manufacturing process and is a plate-like structure with support.

49. The manufacturing method of the semiconductor substrate structure according to claim 47, wherein a dielectric layer in the first circuit structure and a dielectric layer in the second circuit structure are organic thin films.

* * * * *